(12) United States Patent
El-Mellouhi et al.

(10) Patent No.: US 10,553,367 B2
(45) Date of Patent: Feb. 4, 2020

(54) PHOTOVOLTAIC PEROVSKITE OXYCHALCOGENIDE MATERIAL AND OPTOELECTRONIC DEVICES INCLUDING THE SAME

(71) Applicants: Qatar Foundation, Doha (QA); Trinity College Dublin, Dublin (IE)

(72) Inventors: Fadwa El-Mellouhi, Doha (QA); Nouar Tabet, Doha (QA); Fahhad Hussain Alharbi, Doha (QA); Stefano Sanvito, Dublin (IE); Heesoo Park, Doha (QA)

(73) Assignees: QATAR FOUNDATION, Doha (QA); TRINITY COLLEGE DUBLIN, Dublin (IE)

( * ) Notice: Subject to any disclaimer, the term of this patent is extended or adjusted under 35 U.S.C. 154(b) by 0 days.

(21) Appl. No.: 16/165,495

(22) Filed: Oct. 19, 2018

(65) Prior Publication Data

US 2019/0122829 A1    Apr. 25, 2019

Related U.S. Application Data

(60) Provisional application No. 62/574,842, filed on Oct. 20, 2017.

(51) Int. Cl.
*H01G 9/20* (2006.01)
*H01L 51/00* (2006.01)

(52) U.S. Cl.
CPC ....... *H01G 9/2009* (2013.01); *H01L 51/0077* (2013.01)

(58) Field of Classification Search
CPC . H01L 51/0077; H01L 51/422; H01G 9/2027; H01G 9/2009
See application file for complete search history.

(56) References Cited

U.S. PATENT DOCUMENTS

| | | | | |
|---|---|---|---|---|
| 4,110,254 A | * | 8/1978 | Lauder | B01D 53/945 423/213.5 |
| 4,978,515 A | * | 12/1990 | Johnson | C01G 3/006 252/519.33 |
| 5,871,579 A | * | 2/1999 | Liang | C23C 2/04 117/54 |

(Continued)

FOREIGN PATENT DOCUMENTS

| | | | | |
|---|---|---|---|---|
| CN | 104988580 A | * | 10/2015 | C01G 33/006 |
| EP | 1457471 A2 | * | 9/2004 | C01G 33/006 |

OTHER PUBLICATIONS

Kim et al., "New niobium selenites, ANbO(SeO3)2 (a ¼ Na, K, Rb, and Cs): Effect of alkali metal cation size on the dimensionality and intraoctahedral distortion", Journal of Alloys and Compounds 662 (2016) 381-387.*

(Continued)

*Primary Examiner* — Golam Mowla
(74) *Attorney, Agent, or Firm* — K&L Gates LLP

(57) ABSTRACT

Photovoltaic perovskite oxychalcogenide material and an optoelectronic device are provided. The optoelectronic device includes a cathode layer, an anode layer, and an active layer disposed between the cathode layer and the anode layer. In one embodiment, the active layer includes a perovskite oxychalcogenide compound and the perovskite oxychalcogenide compound is $NaMO_2Q$, wherein M is Nb or Ta, and Q is S, Se or Te.

20 Claims, 20 Drawing Sheets

(56) References Cited

U.S. PATENT DOCUMENTS

| | | | | |
|---|---|---|---|---|
| 6,428,765 B1* | 8/2002 | Bedard | B01J 23/002 | 208/134 |
| 8,465,871 B2* | 6/2013 | Juzkow | H01M 2/26 | 429/211 |
| 9,318,270 B2* | 4/2016 | Horiuchi | H01G 9/2059 | |
| 9,331,292 B2* | 5/2016 | Irwin | H01G 9/2027 | |
| 9,701,696 B2* | 7/2017 | Zhu | C07F 7/24 | |
| 9,803,136 B2* | 10/2017 | Kanatzidis | H01L 31/032 | |
| 9,941,480 B2* | 4/2018 | Irwin | H01L 51/0003 | |
| 9,966,198 B2* | 5/2018 | Kanatzidis | H01L 31/032 | |
| 9,983,319 B2* | 5/2018 | Fischer | G01T 1/2006 | |
| 10,263,043 B2* | 4/2019 | Fischer | G21K 4/00 | |
| 10,351,964 B2* | 7/2019 | Yoshida | | |
| 10,388,898 B2* | 8/2019 | Xu | | |
| 2004/0091696 A1* | 5/2004 | Nair | G03C 5/17 | 428/327 |
| 2004/0129922 A1* | 7/2004 | Shibuya | C09K 11/06 | 252/301.36 |
| 2005/0285041 A1* | 12/2005 | Srivastava | C09K 11/772 | 250/361 R |
| 2006/0283701 A1* | 12/2006 | Li | B01J 27/04 | 204/157.52 |
| 2008/0014463 A1* | 1/2008 | Varadarajan | C09K 11/616 | 428/690 |
| 2010/0285352 A1* | 11/2010 | Juzkow | H01M 2/26 | 429/163 |
| 2012/0141864 A1* | 6/2012 | Juzkow | H01M 2/26 | 429/163 |
| 2014/0261645 A1* | 9/2014 | Hoertz | C25B 11/035 | 136/254 |
| 2014/0261646 A1* | 9/2014 | Hoertz | C25B 1/003 | 136/254 |
| 2015/0060743 A1* | 3/2015 | Yashima | H01B 1/08 | 252/519.1 |
| 2015/0136232 A1* | 5/2015 | Snaith | H01L 51/4226 | 136/263 |
| 2015/0295194 A1* | 10/2015 | Kanatzidis | H01L 51/0032 | 136/263 |
| 2016/0111224 A1* | 4/2016 | Charbonneau | H01G 9/2027 | 136/255 |
| 2016/0254472 A1* | 9/2016 | Wang | H01L 51/424 | 136/263 |
| 2016/0379762 A1* | 12/2016 | Gotanda | H01L 51/4273 | 136/256 |
| 2016/0380125 A1* | 12/2016 | Snaith | H01L 51/0032 | 136/256 |
| 2016/0380221 A1* | 12/2016 | Gotanda | H01L 27/30 | 136/249 |
| 2017/0250031 A1* | 8/2017 | Akiyama | B01J 37/34 | |
| 2017/0324053 A1* | 11/2017 | Tabet | H01L 51/4226 | |
| 2018/0090312 A1* | 3/2018 | Pickett | H01L 33/18 | |
| 2018/0239034 A1* | 8/2018 | Tian | G01T 1/2018 | |
| 2018/0258542 A1* | 9/2018 | Yoshida | C25B 1/003 | |

OTHER PUBLICATIONS

Cao et al., "Explorations of New SHG Materials in the Alkali-Metal—Nb5+-Selenite System", Inorg. Chem. 2015, 54, 10978-10984.*

Pless et al., "Tunable Conductivity of Collapsed Sandia Octahedral Molecular Sieves", Chem. Mater. 2007, 19, 4855-4863.*

Ok et al., "Mixed-Metal Tellurites: Synthesis, Structure, and Characterization of Na1.4Nb3Te4.9O18 and NaNb3Te4O16", Inorg. Chem. 2005, 44, 3919-3925.*

Kumar et al., "Enhancement of infrared emission in Er3+, Yb3+ co-doped sodium niobium tellurite nano glass-ceramics", Phys. Status Solidi B 250, No. 4, 837-842 (2013).*

Kim et al., "Nano-crystallization Behavior and Optical Properties of Na2O—Nb2O5—TeO2 Glasses (1)", Journal of the Korean Ceramic Society vol. 40, No. 11, pp. 1078-1084, 2003.*

* cited by examiner

FIG. 1 (A) NaNbO₃    FIG. 1 (B) NaTaO₃
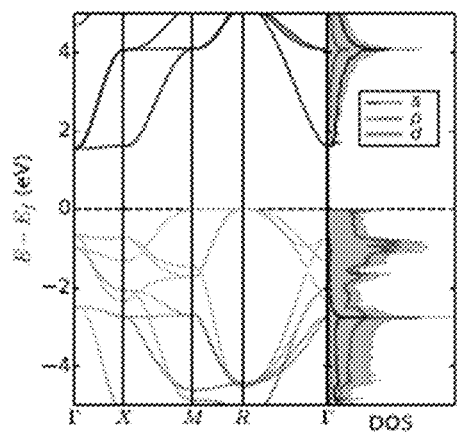 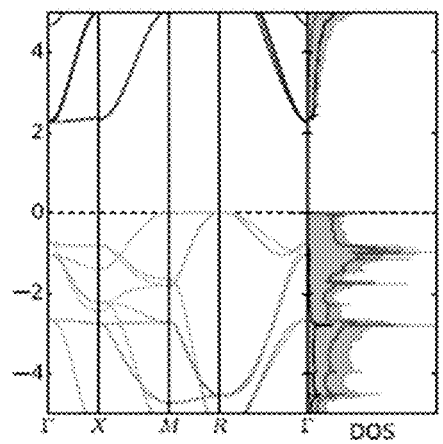
FIG. 1 (C) VB@Γ    FIG. 1 (D) VB@R    FIG. 1 (E) CB@Γ    FIG. 1 (F) CB@R
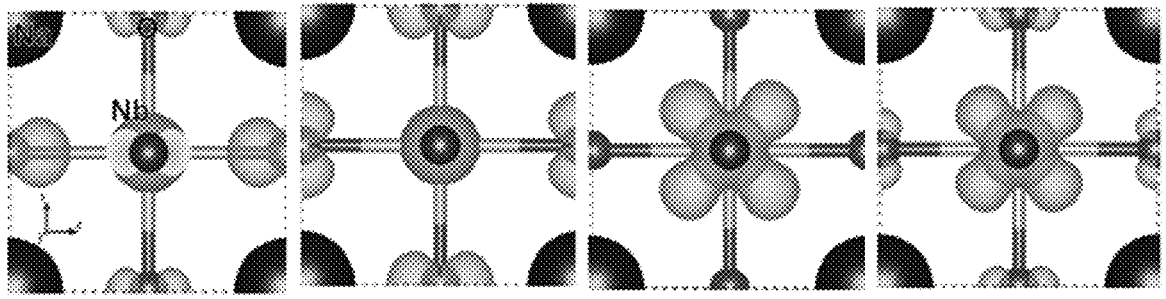

FIG. 2 (A)   NaNbO₃
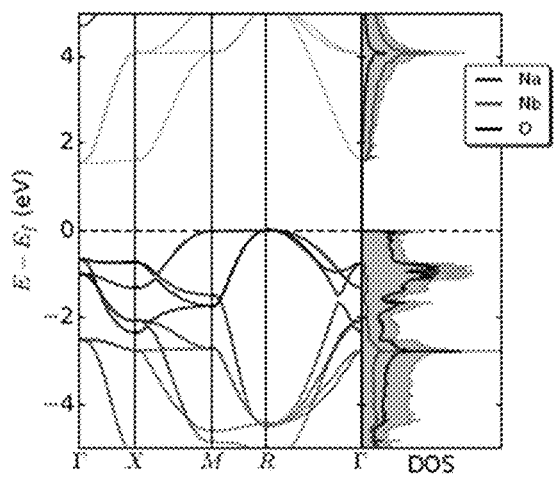
FIG. 2 (B)   NaTaO₃
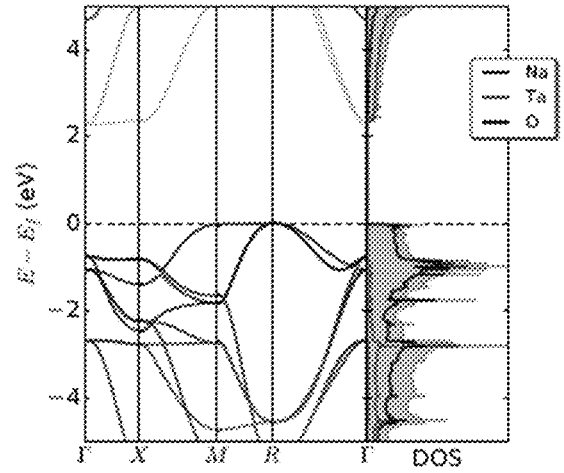

FIG. 6 (A) NaNbO$_3$
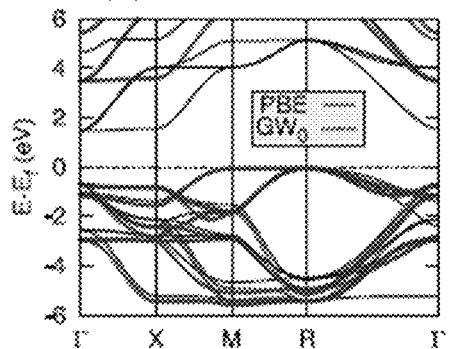
FIG. 6 (B) NaTaO$_3$
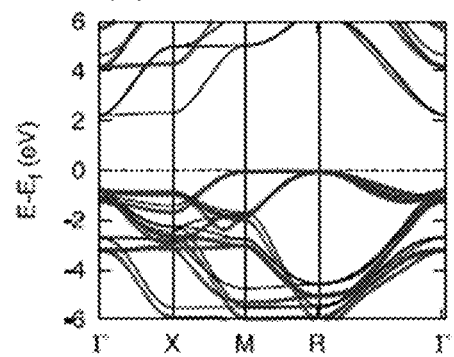
FIG. 6 (C) NaNbO$_2$S
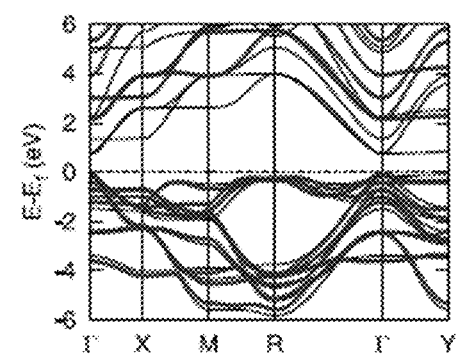
FIG. 6 (D) NaTaO$_2$S
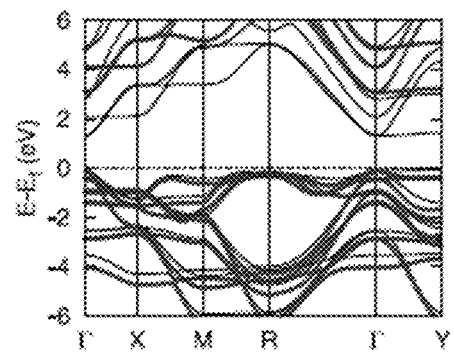
FIG. 6 (E) NaNbO$_2$Se
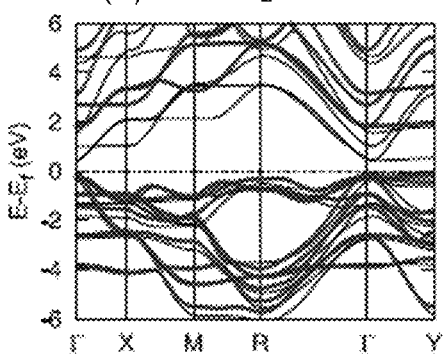
FIG. 6 (F) NaTaO$_2$Se
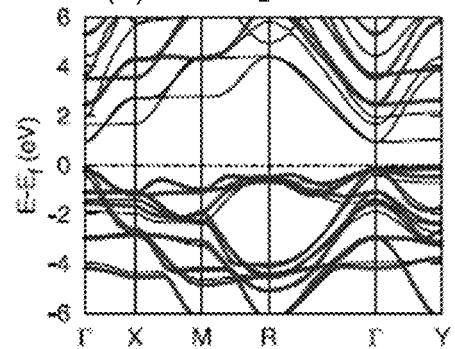
FIG. 6 (G) NaNbO$_2$Te
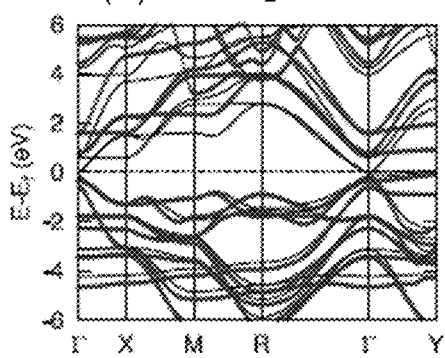
FIG. 6 (H) NaTaO$_2$Te
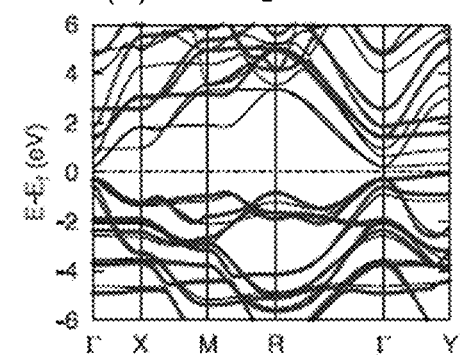

FIG. 7 (A) NaNbO$_2$S
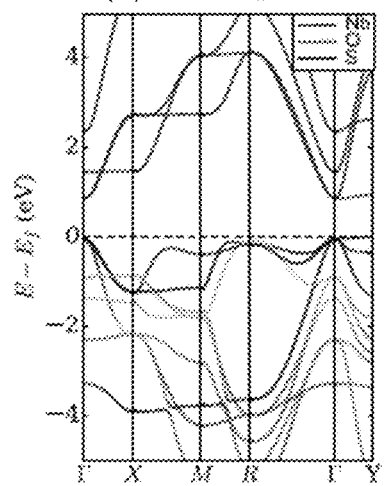
FIG. 7 (B) NaNbO$_2$Se
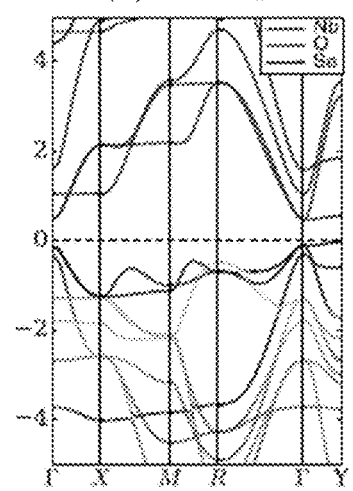
FIG. 7 (C) NaNbO$_2$Te
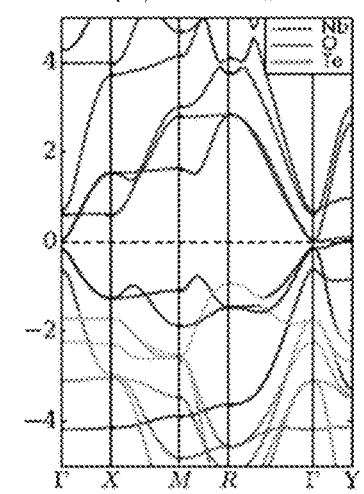
FIG. 7 (D) VB@Γ
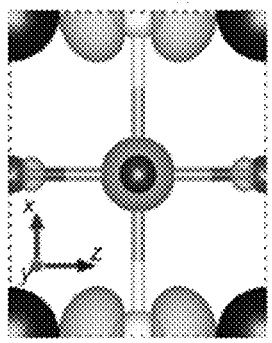
FIG. 7 (E) VB@R
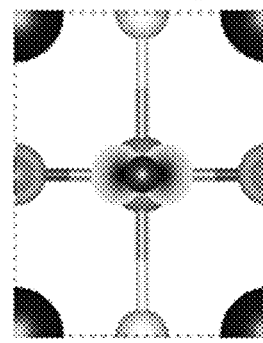
FIG. 7 (F) VB@Y
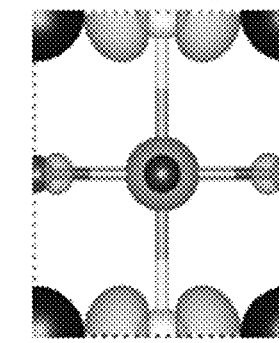
FIG. 7 (G) CB@Γ
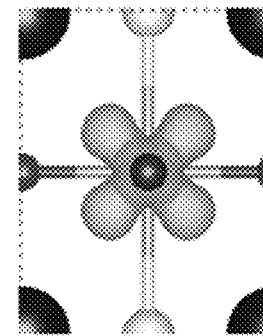

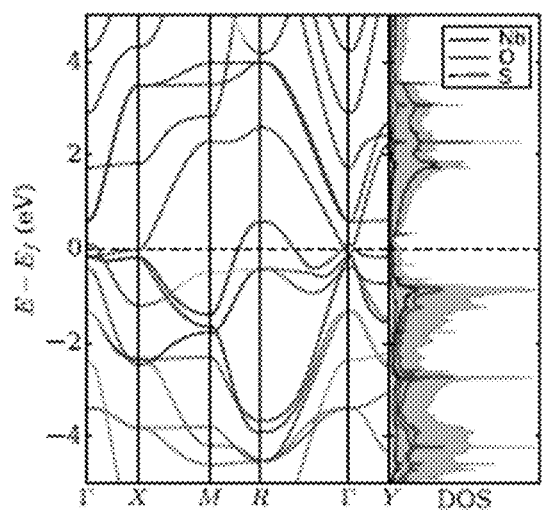
FIG. 11 (A) NaNbOS$_2$
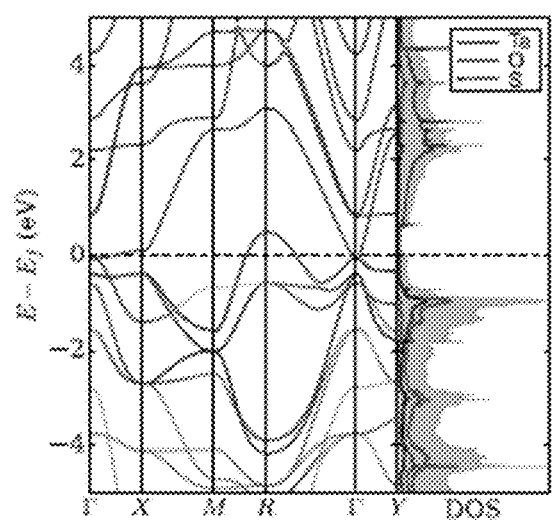
FIG. 11 (B) NaTaOS$_2$

FIG. 14 (A) Na$_4$Nb$_4$O$_{11}$S-α
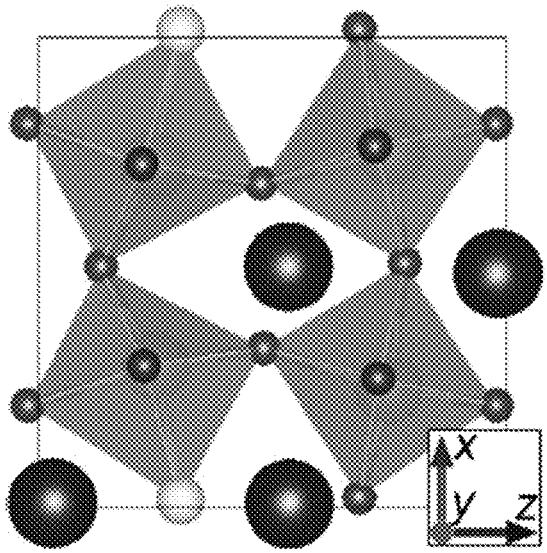
FIG. 14 (B) Na$_4$Nb$_4$O$_{11}$S-β
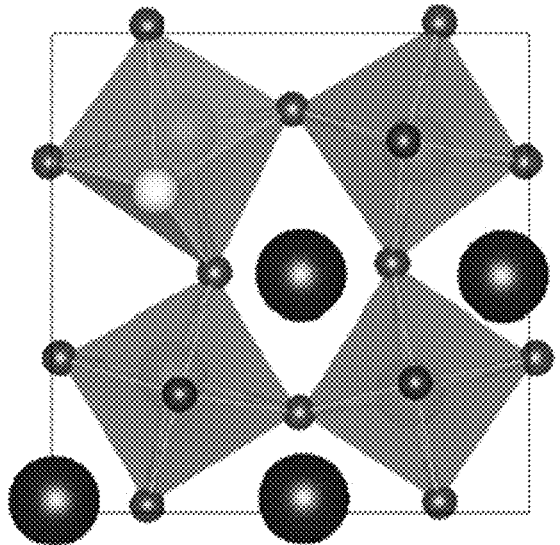
FIG. 14 (C) Band structure of Na$_4$Nb$_4$O$_{11}$S-α
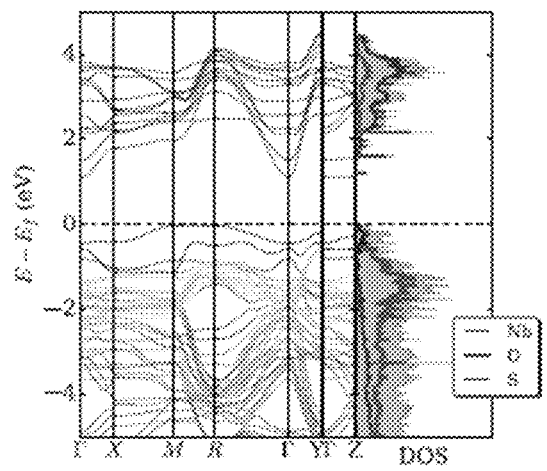
FIG. 14 (D) Band structure of Na$_4$Nb$_4$O$_{11}$S-β
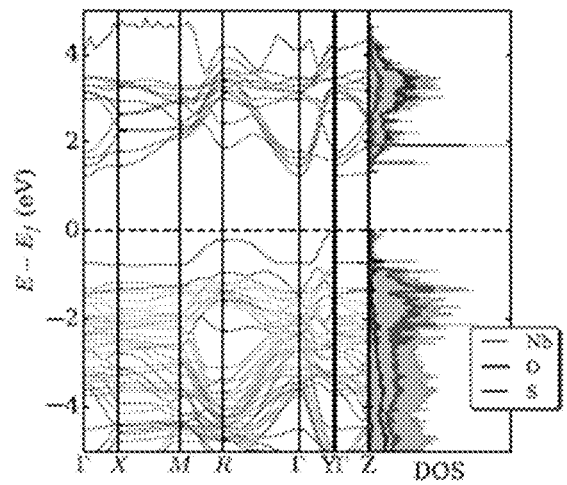

FIG. 16 (A) Doped (4 %) NaNbO$_3$
FIG. 16 (B) Doped (4 %) NaTaO$_3$
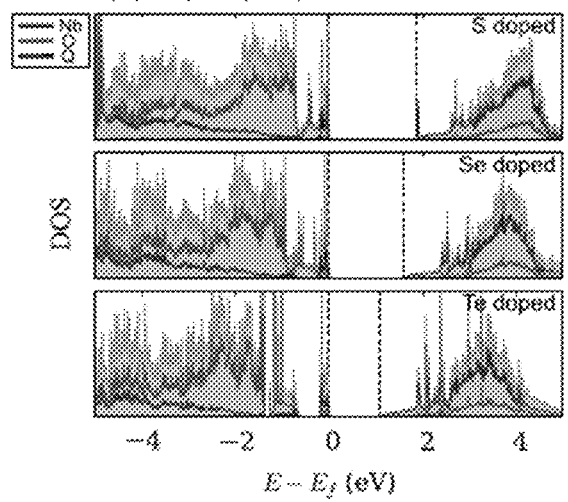
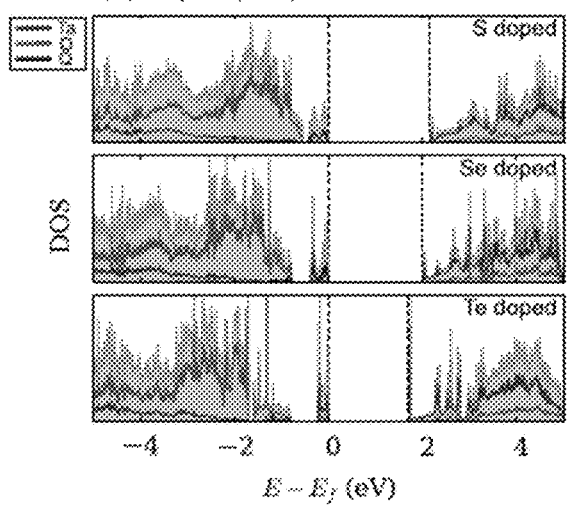

FIG. 17 (a) M=Nb
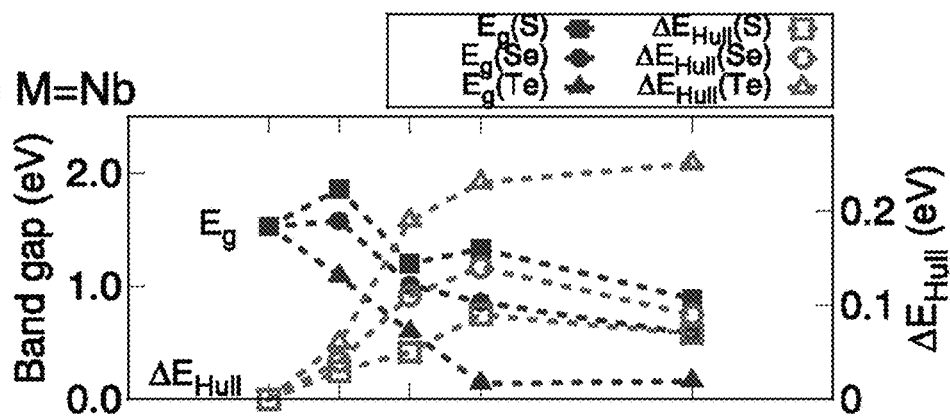
FIG. 17 (b) M=Ta
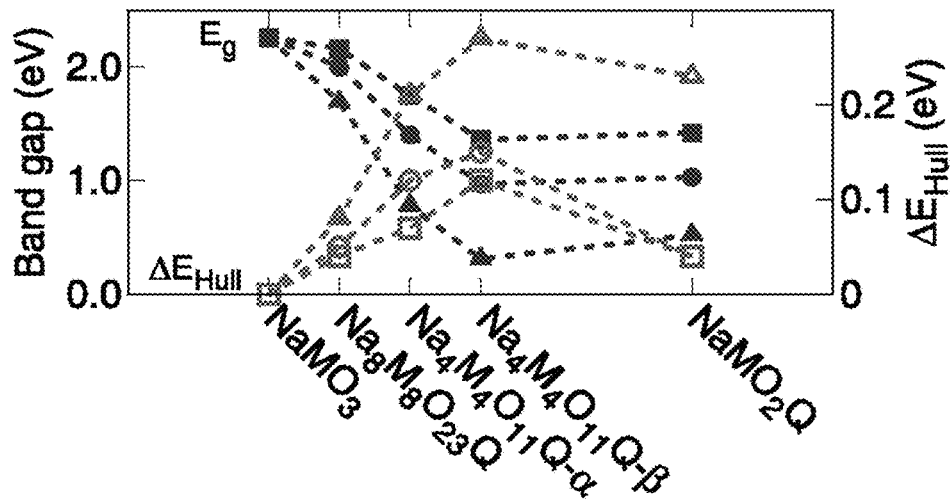

PHOTOVOLTAIC PEROVSKITE OXYCHALCOGENIDE MATERIAL AND OPTOELECTRONIC DEVICES INCLUDING THE SAME

CROSS REFERENCE TO RELATED APPLICATIONS

The present application claims priority to provisional application No. 62/574,842 filed on Oct. 20, 2017, the entire contents of which are being incorporated herein by reference.

BACKGROUND

The demand for alternative energy sources has significantly increased recently. This has resulted in the boost of related developments, deployments, and new technologies. The ongoing thrust for hybrid perovskite solar cells (PSC) is in the midst of these developments. However, halide-based perovskite potentially becomes intrinsically unstable and the degraded halide-based perovskite may contain the toxic element Pb when exposed to ambient conditions.

SUMMARY

According to a non-limiting aspect of the present disclosure, an example embodiment of a photovoltaic perovskite oxychalcogenide material is provided. In one embodiment, the perovskite oxychalcogenide material is $NaMO_2Q$, wherein M is Nb or Ta, and Q is S, Se or Te.

According to another non-limiting aspect of the present disclosure, an example embodiment of an optoelectronic device includes a perovskite oxychalcogenide compound and the perovskite oxychalcogenide compound is $NaMO_2Q$, wherein M is Nb or Ta, and Q is S, Se or Te. The optoelectronic device may include a solar cell device according to an embodiment.

According to another non-limiting aspect of the present disclosure, an example embodiment of a solar cell includes a cathode layer, an anode layer, and an active layer disposed between the cathode layer and the anode layer. The active layer includes a perovskite oxychalcogenide compound and the perovskite oxychalcogenide compound is $NaMO_2Q$, wherein M is Nb or Ta, and Q is S, Se or Te. The perovskite oxychalcogenide compound is at least one of $NaNbO_2S$, $NaNbO_2Se$ and $NaTaO_2Se$. For example, $NaNbO_2Se$ has a calculated theoretical maximum efficiency of 1=30.1%, which is slightly less than the theoretical Shockley-Quisser limit. The perovskite Oxychalcogenides (Oxychalcogenides at 2:1 ratio) demonstrate very low effective masses of electrons and holes indicative of an improved electrical transport compared to the full oxides counterparts. Further, $NaNbO_2S$, $NaTaO_2S$, and $NaTaO_2Se$ are strong visible light absorbers and operate efficiently in photovoltaic devices as efficient visible-light absorbers with suitable charge separation, carrier generation and diffusion.

Additional features and advantages are described herein, and will be apparent from the following Detailed Description and the figures.

BRIEF DESCRIPTION OF THE DRAWING

Features and advantages of the photovoltaic perovskite oxychalcogenide and the optoelectronic devices including the same described herein may be better understood by reference to the accompanying drawings in which:

FIGS. 1A and 1B are graphs plotting a band structure and orbital-projected density of states (PDOS) of (a) $NaNbO_3$ and (b) $NaTaO_3$. In the band structure, the contribution of s, p, and d orbital is indicated by red, green, and blue line, respectively. In the PDOS graph, the gray-filled area represents the total density of states (DOS). FIGS. 1C-1F are graphs plotting isosurfaces (gray lobes) of partial charge density of $NaNbO_3$. Moving from left to right, the charges are in the state of the valence band at the Γ (0, 0, 0) and R (½, ½, ½) points and of the conduction band at the Γ and R point. The Fermi level, $E_f$ is set at the valence band maximum (VBM). All calculations were performed with density functional theory (DFT) at the Perdew-Burke-Ernzerhof (PBE) functional level.

FIGS. 2A and 2B are graphs plotting a band structure and site-projected density of states (PDOS) of (A) $NaNbO_3$ and (B) $NaTaO_3$. In the band structure, along the band, the contribution of Na, M, and O orbital is delineated by red, green, and blue color, respectively. And gray-filled area depicts total DOS.

FIGS. 6A-6H are graphs plotting band structures of (A) $NaNbO_3$, (B) $NaTaO_3$, (C) $NaNbO_2S$, (D) $NaTaO_2S$, (E) $NaNbO_2Se$, (F) $NaTaO_2Se$, (G) $NaNbO_2Te$, and $NaTaO_2Te$ calculated by PBE and $GW_0$ methods, showing the rigid shift of the bands leading to band gap increase without altering the dispersion of the bands and thus the hole and electron effective masses.

FIGS. 7A-7C are graphs plotting site-contribution-colored band structure of (A) $NaNbO_2S$, (B) $NaNbO_2Se$, and (C) $NaNbO_2Te$. FIGS. 7D-7G are graphs plotting isosurfaces (gray lobe) of partial charge density of $NaNbO_2S$. Moving from left to right, the charge densities are in the state of the valence band at the Γ (0, 0, 0), R (½,½,½), and Y (0, ½, 0) points, and of the conduction band at the Γ point (left to right respectively). The $E_f$ is set to the VBM. All calculations have been performed at the DFT PBE level.

FIGS. 11A and 11B are graphs plotting the band structure and site-projected density of states of (A) $NaNbOS_2$ and (B) $NaTaOS_2$. The site-projected band structure and DOS are represented by red, green, and blue color according to the contribution of the transition metal, O, and S, respectively. All calculations have been performed at the DFT PBE level.

FIGS. 14A-14D are graphs plotting the atomic structure and band structure of 8%-doped system of $Na_4Nb_4O_{11}S$ (2×1×2 supercell). FIG. 14 (A) An apical O is substituted with S, as denoted by $Na_4Nb_4O_{11}S$-α, in which the S constitutes the —S—Nb—O—Nb—S— chain along the x-axis, FIG. 14 (B) an equatorial O is substituted with S, $Na_4Nb_4O_{11}S$-β, in which the S forms the —S—Nb—S— chain along the y-axis. FIG. 14 (C) is a band structure of $Na_4Nb_4O_{11}S$-α as illustrated in FIG. 14 (A), and FIG. 14 (D) is a band structure of $Na_4Nb_4O_{11}S$-β as illustrated in FIG. 14 (B).

FIGS. 16A and 16B are graphs plotting the site-projected density of states of the doped compounds for study of chalcogen concentration. All calculations have been performed at the PBE level.

FIGS. 17A and 17B are graphs plotting the summary of band gaps, $E_g$, and the energies above convex Hull, $\Delta E_{Hull}$, as function of the chalcogen ratio. $NaMO_3$, $Na_8M_8O_{23}Q$, $Na_4M_4O_{11}Q$ ($Na_4M_4O_{11}Q$-α, $Na_4M_4O_{11}Q$-β) and $NaMO_2Q$ were obtained from the 1×1×1, 2×2×2, 2×1×2 and 1×1×1 supercells, respectively, where M=(a) Nb or (b) Ta. The dopant concentrations of these are 0, 4, 8 and 33%, respectively. All calculations have been performed at the DFT PBE level.

Figure 3:
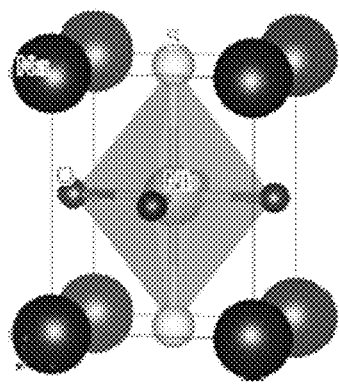
FIG. 3A is a graph plotting relaxed structure of $NaNbO_2S$.
FIG. 3B is a graph plotting comparisons of the Shannon ionic radii (6-coordinated $O^{2-}$ and $Q^{2-}$) and the calculated energy level of the valence p orbitals of isolated O, S, Se, and Te.
Figure 3:
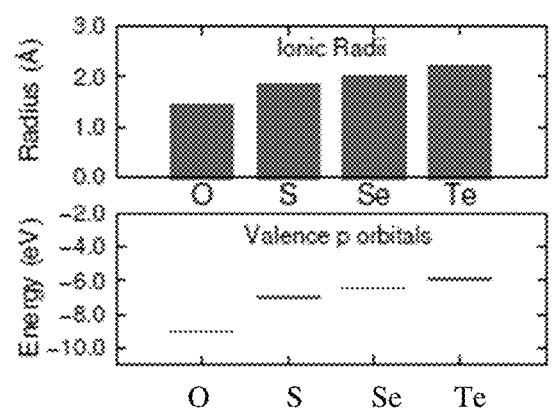

The reader will appreciate the foregoing details, as well as others, upon considering the following detailed description of certain non-limiting embodiments of the perovskite oxychalcogenide and the optoelectronic devices including the same according to the present disclosure. The reader may also comprehend certain of such additional details upon using the perovskite oxychalcogenide and the optoelectronic devices including the same described herein.

DETAILED DESCRIPTION

The present disclosure provides a photovoltaic perovskite oxychalcogenide material. In one embodiment, a non-toxic photovoltaic perovskite oxychalcogenide material is $NaMO_2Q$, wherein M is Nb or Ta, and Q is S, Se or Te. Referring to FIG. 1, the primitive unit cell of $NaMO_3$ was taken as starting structure to understand the main features of these oxide perovskites, with the aim of building a detailed analysis of their main characteristics. The unit cell consists of 5 atoms in a unit cell adopting the perovskite structure, with space group P4/mmm. Starting from the structures contained in the ICSD database, the fully relaxed geometry of $NaNbO_3$ and $NaTaO_3$ adopts the cubic perovskite form with lattice parameters 4.01 Å and 3.98 Å, respectively. The band gaps, calculated at the level of the Perdew-Burke-Ernzerhof (PBE) functional, are indirect and measure respectively 1.53 eV and 2.26 eV, as shown in FIG. 1. The valence band maximum (VBM) is located at the R point, while the conduction band minimum (CBM) resides at the Γ point. The orbital contribution is color coded in both the band diagram and the projected density of states (PDOS) features a VBM dominated by p orbitals, while the CBM is dominated by the d ones.

In order to better understand the contributions from the orbitals of the constituent atoms, the bands at the Γ and the R points are decomposed and the resulting partial charge densities are shown in FIG. 1C. The valence band at Γ is dominated by σ bonds as well as the π bonds, which participate to the formation of —Nb—O— chains. These 3 equivalent states constitute one band among the three-fold degenerate valence manifold. At the same time, the state at the R point is contributed by O p orbitals having only π interactions with Nb in the —Nb—O— chain and no contribution from Nb to this band. The state at R in the valence band is located at a higher energy level than the state at the Γ point. Also, the VBM at R is triply degenerate with one of the bands being flat, indicating that the O p orbitals are localized. As one can see in the band structures of $NaMO_3$ (M=Nb, Ta) in FIG. 1A-B, the valence band at Γ is located below R by a distinct contribution of the $d_π$-$p_σ$ character between M and O in the octahedral structure. In the M-O bond, the contribution of the σ bond at Γ is comparable and one can see that only the $d_π$-$p_π$ character is predominant at R. On the contrary, the conduction band is dominated by the d orbital of Nb with its minimum being located at the Γ point. The energy of the conduction band is slightly higher at the R point, owing to the antibonding d-p interaction between Nb and O. This makes the band gap indirect. When comparing the band gaps of the two transition metal perovskites, the present inventors have surprisingly discovered that the band gap of $NaNbO_3$ is lower because the position of the ionic energy levels of Nb 4d is lower than that introduced by the Ta 5d ones.

The electronic band gaps calculated at different levels of theory are listed in Table 1. When spin-orbit coupling (SOC) is considered, the calculated electronic band gap is reduced by 0.04 eV and 0.17 eV, for $NaNbO_3$ and $NaTaO_3$, respectively. The spin-orbit splitting of the valence or conduction band edge reduces the band gap further than that obtained with PBE without SOC. However, it is well known that the GGA functional underestimates band gaps, since it inherently lacks of long-range correlation. Furthermore, in principle, the band gap cannot be described properly by the electronic density at the ground state because it is an excited-state property. Thus, by using quasi-particle perturbation theory, the calculated $GW_0$ quasi-particle band structure returns the large gaps of 3.3 eV and 4.0 eV for $NaNbO_3$ and $NaTaO_3$, respectively. Those are in excellent agreement with the experimental data of optical gaps.

TABLE 1

Calculated band gaps (eV) of perovskite oxide by PBE, PBE with spin-orbit coupling (PBE + SOC), $G_0W_0$, and $GW_0$ methods. "exp" indicate available experimental data.

| Compound | PBE | PBE + SOC | $G_0W_0$ | $GW_0$ | exp[α] |
|---|---|---|---|---|---|
| $NaNbO_3$ | 1.53 | 1.49 | 2.97 | 3.31 | 3.3 |
| $NaTaO_3$ | 2.26 | 2.09 | 3.67 | 4.00 | 4.0 |

Figure 5:
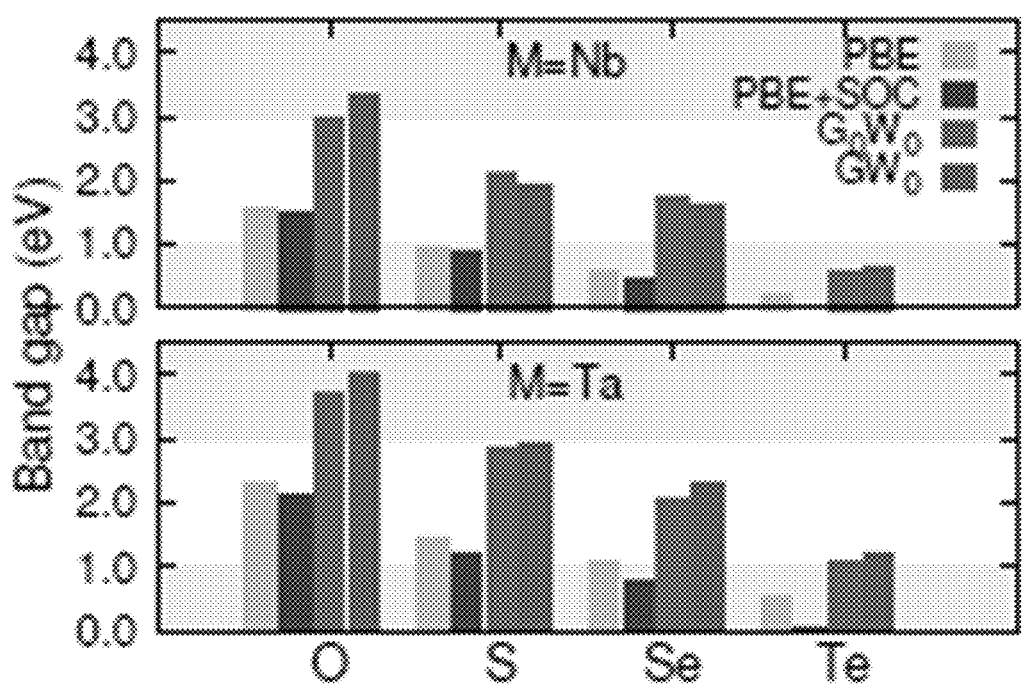
FIG. 5 is a graph plotting band gaps of $NaMO_3$ and $NaMO_2Q$ compounds calculated with the PBE, PBE+SOC (SOC=spin-orbit coupling), $G_0W_0$, and $GW_0$ methods with respect to the apical atom substituted in the $MO_6$ octahedra. The yellow shaded region delimits the visible region of the solar spectrum pointing to the desired band gap range.

The calculated gaps of NaNbO$_3$ and NaTaO$_3$ fall outside the visible range of the solar spectrum (yellow shaded region in FIG. 5). Hence these materials are not optimal for use as light absorbing photovoltaic media. In the next sections, our effort will focus on reducing their band gap by oxygen partial substitution. The present inventors have shown above that the VBM is dominated by O 2p orbitals, hence a band gap reduction maybe obtained by lifting these states upwards by means of replacing some O atoms with the chalcogens S, Se and Te. Such chalcogens, in fact, possess ionic energy levels above those of oxygen (see FIG. 3B).

After the substitution of the apical O atom (⅓ O) with a chalcogen (S, Se, Te) in the perovskite structure, the present inventors have optimized the geometry of NaMO$_2$Q (Q=S, Se, Te) by relaxing all the degrees of freedom (ions position, cell volume and cell shape). The three dimensional corner-sharing octahedral coordination (MO$_6$), originally present in pristine NaMO$_3$, remains preserved. However, it is found that the cubic symmetry is broken due to the elongation along the axis of the -M-Q- chain leading to an overall tetragonal symmetry. The M-Q bond is longer than the M-O one because of the ionic size increase (see FIG. 3B) as the valence shell gets more extended by moving from O (2p$^4$) to S (3p$^4$), to Se (4p$^4$), and to Te (5p$^4$). This gives rise to two long M-Q bonds and shorter M-O ones as summarized in Table 2. The bond length increases between 0.52 Å to 0.86 Å depending on the chalcogen atom inserted. The remaining M-O bond lengths do not change significantly compared with the bond in NaMO$_3$, as the localized p orbital of the oxides still makes the band flat. The Q-M-Q angles retain their nearly 180 feature, thus preserving fairly non-distorted and non-tilted nor rotated MO$_4$Q$_2$ octahedra.

TABLE 2

MO$_4$Q$_2$ octahedral parameters such as bond lengths (Å) and angles (°), and the lattice parameters a, b, and c (Å) of the relaxed unit cells.

| Compound | l(M-O) | l(M-Q) | ∠Q-M-Q | a | b | c |
|---|---|---|---|---|---|---|
| NaNbO$_3$ | 2.00 | | 179.99 | 4.01 | 4.01 | 4.01 |
| NaNbO$_2$S | 1.99 | 2.52 | 179.98 | 5.04 | 3.98 | 3.98 |
| NaNbO$_2$Se | 2.00 | 2.65 | 179.98 | 5.31 | 3.99 | 3.99 |
| NaNbO$_2$Te | 2.02 | 2.86 | 179.98 | 5.72 | 4.04 | 4.04 |
| NaNbOS$_2$ | 1.96 | 2.47 | 179.98 | 3.93 | 4.93 | 4.93 |
| NaTaO$_3$ | 1.99 | | 179.99 | 3.98 | 3.98 | 3.98 |
| NaTaO2S | 1.98 | 2.50 | 179.98 | 5.01 | 3.95 | 3.95 |
| NaTaO$_2$Se | 1.98 | 2.64 | 179.98 | 5.29 | 3.97 | 3.97 |
| NaTaO$_2$Te | 2.01 | 2.85 | 179.98 | 5.70 | 4.01 | 4.01 |
| NaTaOS$_2$ | 1.95 | 2.45 | 179.99 | 4.91 | 4.91 | 4.91 |

The present inventors have assessed the position of the highest occupied energy level of the isolated chalcogen atoms by performing calculation with a 15 Å×15 Å×15 Å cubic cell containing one atom and using the PBE functional. The present inventors have computed the S 3p orbital at 2.0 eV above the O 2p (FIG. 3B), while the 4p of Se and the 5p of Te are higher than the 2p of O by 2.6 and 3.2 eV, respectively. Such higher energy levels of the anion valence shell might not only shift upwards the VBM, but also may influence the interaction with the valence orbitals of the transition metal by adapting the Pm3̄m space group from the P4/mmm one. The resulting band gaps are plotted in FIG. 5, where the present inventors report different levels of theory. As a general feature, oxychalcogenide perovskites have a band gap narrower than that of the corresponding oxide perovskites. In addition, the band gap reduction is more significant when the SOC is included. This is more pronounced for higher-atomic-number species such as Se and Te.

In addition to the desired band gap reduction, the band gap turns out to be direct upon chalcogen substitution (as shown in FIG. 7) with both the VBM and the CBM being located at the Γ point. A deeper analysis shows that along the -M-Q- chain, the π interaction of the chalcogen plays a significant role in shifting upward the valence band at the Γ point (VB@Γ). At the same time, the valence shell of the Q anion starts to dominate the top of the valence band at the Γ point and hence the Fermi level rises relatively, while the energy level of the conduction band remains pinned at Γ. The energy level of the valence band at R (VB@R) is relatively lower, since the O p orbitals are localized along the -M-Q- chain and the S p orbitals have much less contribution at this wave vector.

The site-projected band structure of NaNbO$_2$S demonstrates the strong contribution of the O p and the S p orbitals (FIG. 7A). In addition, FIG. 7D depicts the partial charge densities, which are contributing to the valence and conduction bands of NaNbO$_2$S at selected k-vectors in the Brillouin zone. One can clearly notice that the VBM at the Γ point (VBM@Γ) is dominated by the S p orbital parallel to the σ bond in the —Nb—O— chain. The VBM state is shifted upwards in energy by the π bond between Nb and S, because of the higher energy level of S p orbital. As a result, the band gap is reduced further by moving upwards the states at the Γ point above those at the R point, thus making the band gap direct. Moreover, moving from S to Se to Te, thus reducing the electronegativity of the chalcogen ion, the states became more delocalized. By comparing the band structures of NaMO$_3$, one can notice a higher energy dispersion, in particular, along the Γ-R and Γ-X paths.

The PBE functional returns a valence band at the Y point to be 80 meV higher than that of the Γ point, although it is nearly flat between the two points. However, when the present inventors calculate the energy level by taking into account the proper quasi-particle energies, the level at the Y point get shifted downwards slightly compared to that at the Γ point with apical S and Se, as shown in the band structure calculated by GW$_0$ in FIG. 6. In addition, the band structure including the orbital contributions (FIG. 7A-B) shows that the orbitals of the Q atom contribute predominantly to the state at the Y point in the valence band as indicated by the blue color. Consequently, the band gap nature is direct in the case of S and Se. In contrast, when Q is Te, it appears that the VBM is now located at the Y point even when the bands are computed at the GW$_0$ level. It is worth noting the SOC is significant in the case of Te, and computationally expensive GW+SOC calculations might be needed to conclude about the band gap. PBE calculations including SO interaction and a scissors operator could be used effectively to obtain a good estimate of this value. As the size of the valence shell increases, the higher energy level of the valence band is higher at the Y point. For NaMO$_2$Q compounds the higher energy is attributed to the overlap of the orbitals of Q with neighboring atoms.

Figure 9:
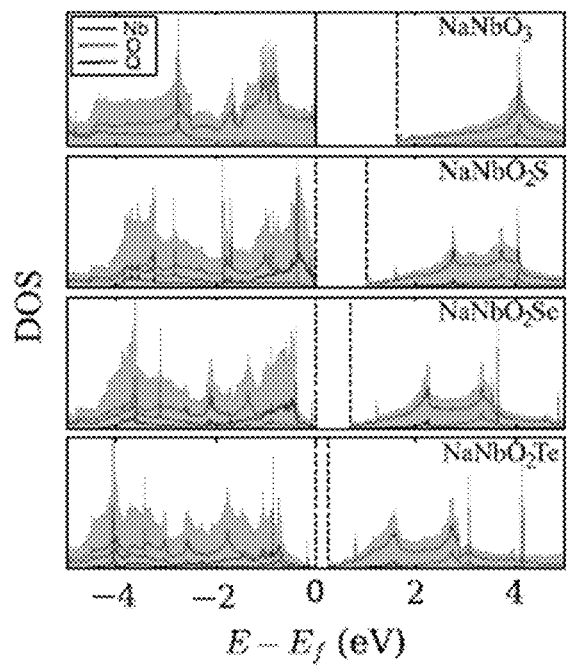
FIGS. 9A and 9B are graphs plotting site-projected DOS of compounds where (A) M=Nb and (B) M=Ta. The contribution of the particular site is presented by red, green, and blue solid lines for M, O, and Q, respectively. The $E_f$ is set to the VBM. All calculations have been performed at the DFT PBE level.
Figure 9:
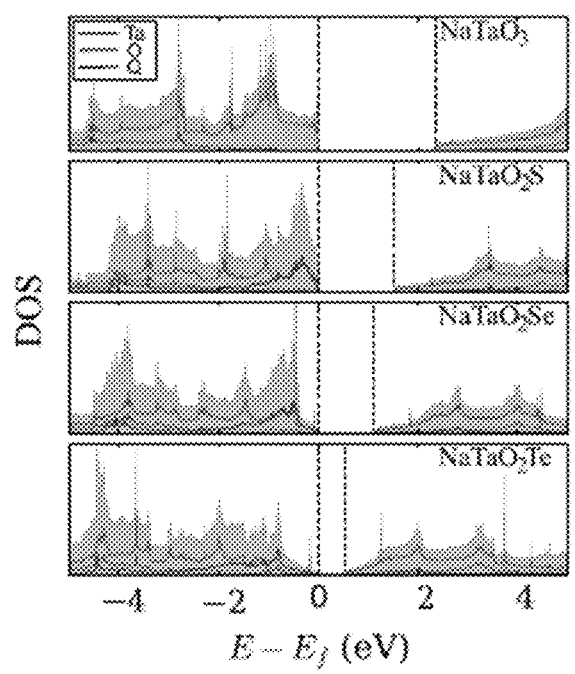

In FIG. 9, the site-projected DOS of the compounds studied is shown. It should be noted that the edge of the valence and conduction bands are shifted and the band gaps are subsequently reduced. The site-projected DOS shows that the contribution from the Q site is of comparable significance as the one from the O site. The energy level of the O site is pushed upwards in energy by forming the M-Q bond with the delocalized character of the valence shell of Q. In other words, the electrons in the valence shell become all available for light excitation, as there is strong orbital hybridization between the Q p and M d orbitals as much as between the O p and M d ones. In conclusion, a significant alteration of the band structures occurs when NaNbO$_3$ and NaTaO$_3$ have the apical O atom (⅓ O) substituted with S, Se, or Te, leading to significant band gap reduction and a change in the band gap nature from indirect to direct.

In order to check the robustness of the additional oxygen substitution with the chalcogen ions, the present inventors have also computed compounds with ⅔ O$_O$ replacement by substituting two equatorial O atoms with S to obtain NaMOS$_2$ and with all the O ions replaced by S to yield NaMS$_3$. The band edges near the Fermi level shift further upward, but the compound NaMOS$_2$ and NaMS$_3$ turn out to be metallic when computed at the PBE level. At the R point, as shown in FIG. 11, the band is dominated by sulfur states and is much higher than the Fermi level. The energy level of the band is mainly attributed to the P orbitals in the -M-S— chain. As only sulfur forms bonds in the equatorial plane, this raises the energy level. Although GW$_0$ calculations shows a finite gap, as listed in Table 3, of 0.13 eV and 0.24 eV for NaNbOS$_2$ and NaTaOS$_2$, respectively, this is too small for the material to be considered as an active photovoltaic compound.

Hence the present inventors conclude that ⅓ O substitution with chalcogen ions constitutes the upper alloying limit that enables the reduction of the band gap of Nb and Ta oxide perovskites to the visible range and its change from indirect to direct. The present inventors have identified candidates with GW band gap within the visible spectra, namely NaMO$_2$S and NaMO$_2$Se. Those are the potentially efficient absorbers among the compounds studied with appropriate direct band gaps. Before turning out attention to an in-depth analysis of the electronic transport, chemical stability and PV efficiency of such perovskites, the present inventors will assess their robustness by applying the same methodology used to more dilute chalcogen concentrations.

TABLE 3

Band gaps of perovskite oxychalcogenides (NaNbOS$_2$, NaTaOS$_2$) and perovskite sulfide (NaNbS$_3$, NaTaS$_3$) calculated with PBE, PBE with spin-orbit coupling (PBE + SOC), G$_0$W$_0$, and GW$_0$.

| Compound | PBE | PBE + SOC | G$_0$W$_0$ | GW$_0$ |
|---|---|---|---|---|
| NaNbOS$_2$ | 0.0 | 0.0 | 0.09 | 0.13 |
| NaTaOS$_2$ | 0.0 | 0.0 | 0.16 | 0.24 |
| NaNbS$_3$ | 0.0 | 0.0 | 0.0 | 0.0 |
| NaTaS$_3$ | 0.0 | 0.0 | 0.0 | 0.0 |

Figure 4:
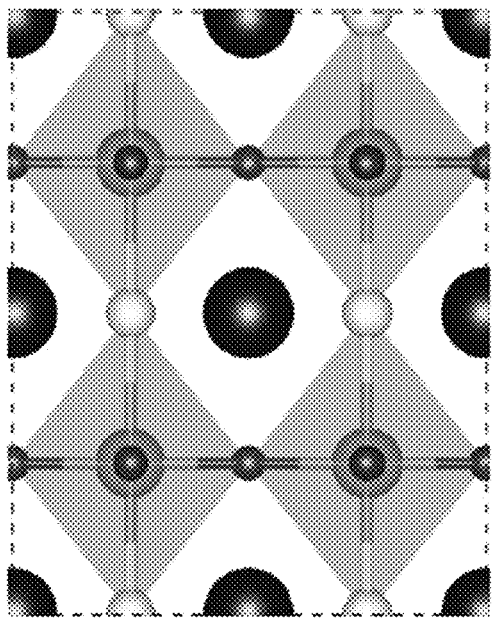
FIGS. 4A and 4B are graphs plotting optimized structures of 2×2×2 supercell of (A) $NaNbO_2S$ and (B) $NaNbO_2Se$. Blue, dark green, red, yellow, and light green spheres denote Na, Nb, O, S, and Se, respectively.
Figure 4:
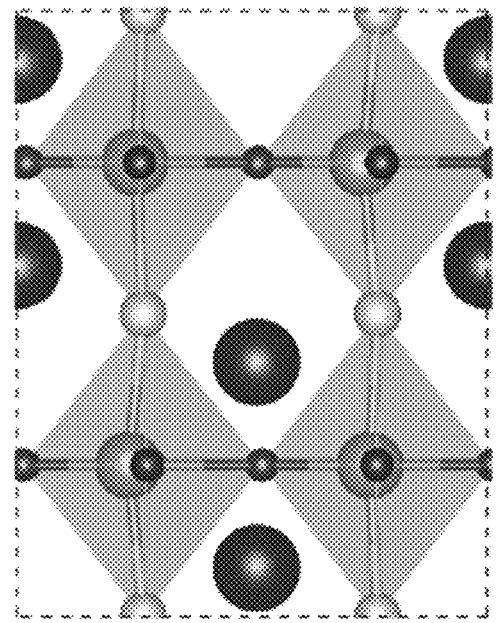
Figure 13:
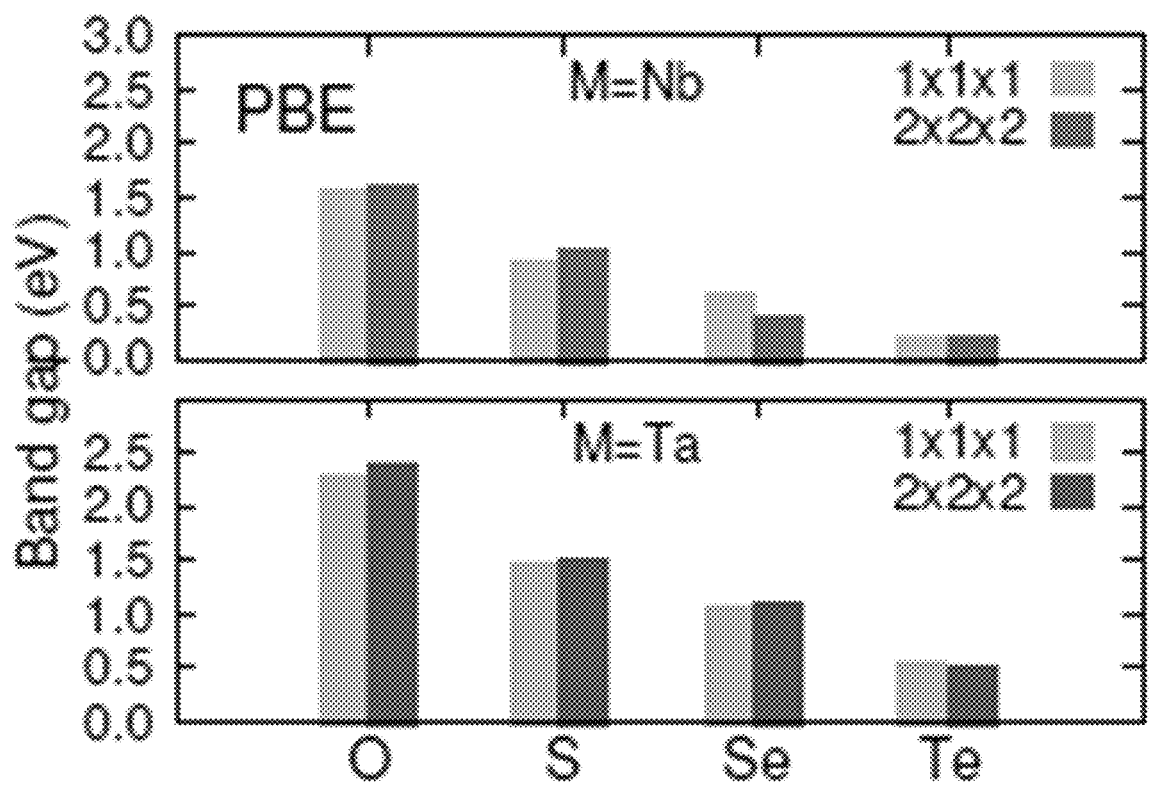
FIG. 13 is a graph plotting the calculated band gaps of 2×2×2 supercells and comparison with the band gaps obtained for the primitive unit cell (1×1×1). The DFT PBE functional was used during the calculation.

The present inventors have relaxed 2×2×2 supercells of the oxychalcogenide perovskite structures in order to investigate their structure stability with respect to deformation over the elementary cubic perovskite lattice. In the 2×2×2 supercells, the octahedral structure around the transition metal is found. It is notable that for all compounds the band gap of the 2×2×2 supercell reproduces that of the unit cell within 0.1 eV, reflecting the fact that the additional distortion of the octahedral coordination of the larger cell is small. The only exception is NaNbO$_2$Se, in which the Nb atoms become displaced, forming shorter bonds with oxygen. The Nb ions are displaced toward one of O atom by 0.13 Å, as shown in FIG. 4B. Owing to the notable displacement in NaNbO$_2$Se, the band gap is reduced by 0.2 eV. For each compound the total energy per atom is within 1 meV from that of the corresponding primitive unit cell, even in the case of NaNbO$_2$Se where there is significant displacement. Similar to our results obtained for the unit cell, the octahedral structure shows that the band gap decreases with increasing the atomic number of the chalcogen ion as shown in FIG. 13.

Figure 15:
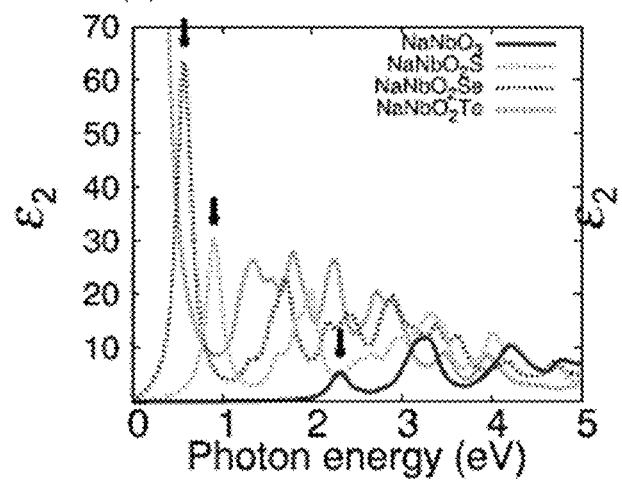
FIGS. 15A and 15B are graphs plotting the imaginary part of the dielectric functions, E2, calculated by using the DFT PBE functional for (A) M=Nb and (B) M=Ta compounds (primitive unit cell calculations). The first peaks are indicated by black arrows for $NaMO_3$, $NaMO_2S$, and $NaMO_2Se$.
Figure 15:
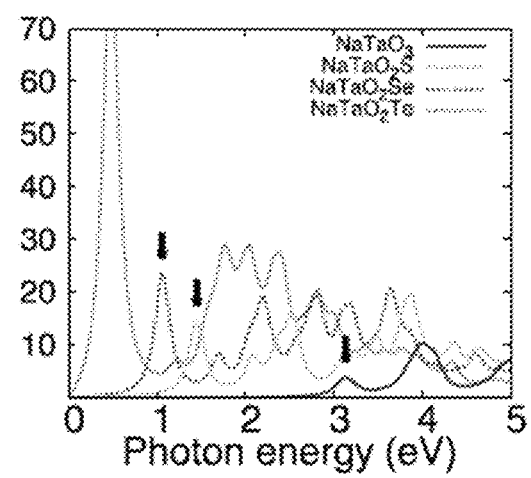
Figure 18:
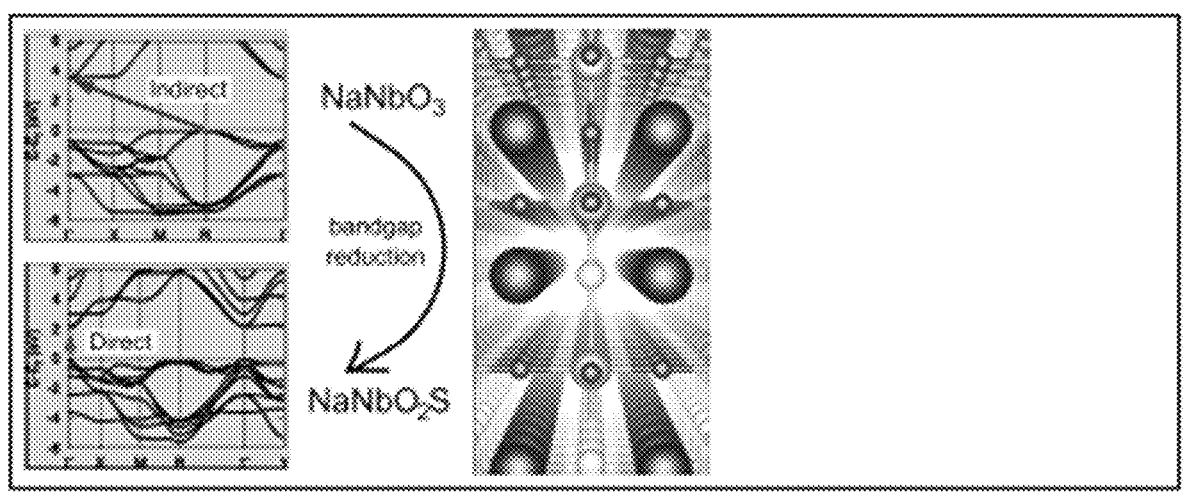
FIG. 18 is a graph plotting the band structure of $NaNbO_3$ and $NaNbO_2S$.
Figure 19:
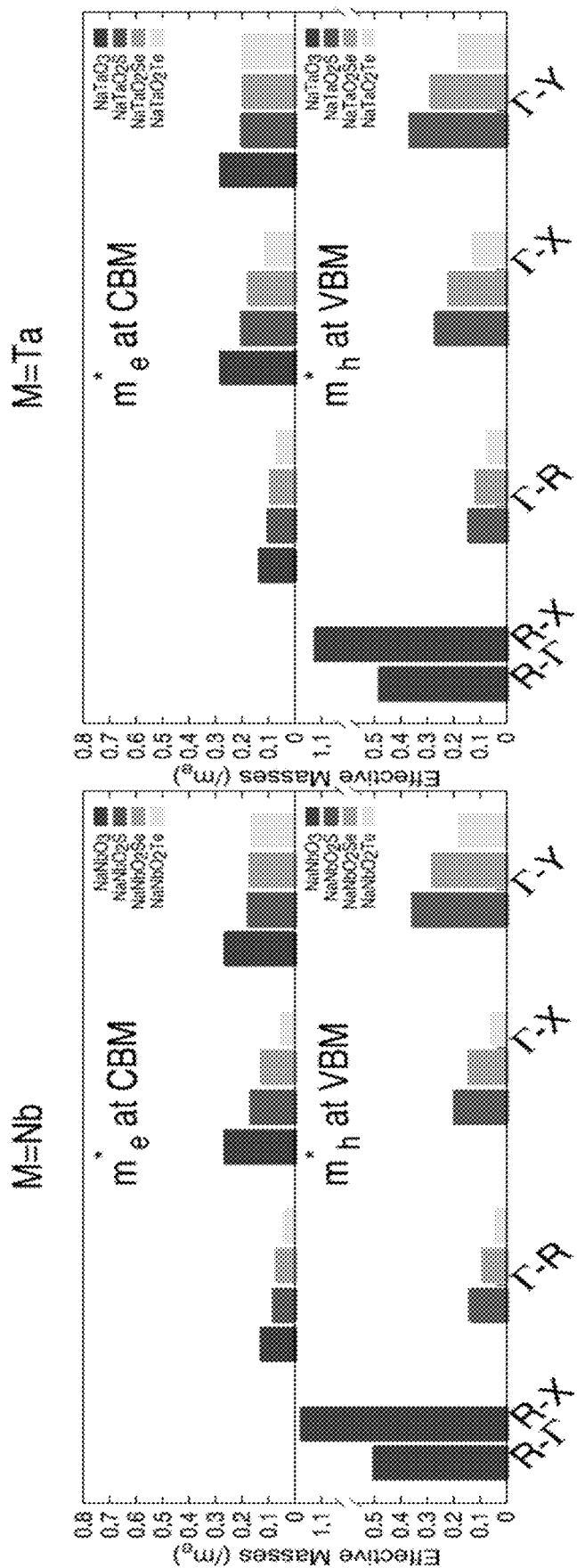
FIG. 19 is a graph plotting effective masses of charge carriers in $NaMO_2Q$.

The present inventors now move to describe the materials optical properties as calculated at the PBE level for the primitive cell. FIG. 15 introduces the imaginary part of the dielectric function. This it directly related to the transition probability of electrons to be transferred from the valence to conduction manifold by an incoming photon. Within the long-wavelength limit q→0, in which q is the Bloch vector of the incident wave, the frequency-dependent imaginary part is given by independent particle approximation.

$$\epsilon^{(2)}_{\alpha,\beta}(\omega) = \frac{4\pi^2 e^2}{\Omega} \lim_{q \to 0} \frac{1}{q^2} \sum_{c,v,k} 2\omega_k \delta(\epsilon_{ck} - \epsilon_{vk} - \omega) \times \langle u_{ck+e_{\alpha q}} | u_{vk} \rangle \langle u_{ck+e_{\beta q}} | u_{vk} \rangle^*,$$

where the indices c and v refer to the conduction and the valence band states respectively, and the $u_{ck}$ ($u_{vk}$) is the periodic wavefunction in the conduction (valence) band at the k-point, k. Here $e_{\alpha q}$ stands for one Cartesian component, α, of the unit vector $e_q$. The transition matrix elements are summed over k in the Brillouin zone.

The first peak, corresponding to the absorption edge, is associated to the band gap of the material. In contrast, due to the indirect band gap, for the pristine oxide compounds the first peaks appear at an energy higher than the band gap of the corresponding compound. For instance, the present inventors could not observe any peak at 1.53 eV and 2.26 eV, namely at the energy associated to the band gaps of NaNbO$_3$ and NaTaO$_3$, respectively. In contrast to the pristine compounds, the oxychalcogenide perovskites have a direct band gap and in general they absorb photons at an energy lower than in the pristine oxides. The first absorption peaks display at a lower energy than those of NaNbO$_3$ and NaTaO$_3$ by 1.4 eV and 1.7 eV, respectively.

Furthermore, it can be noted that the intensity of the first peaks increases as the band gap narrows by moving from S, to Se, or to Te, mainly because of direct electronic transitions at the band extrema located at the Γ point. Moreover, in accordance with the equation for $\epsilon^{(2)}(w)$, the spatial overlap of the wavefunctions becomes higher due to the delocalization of the valence shells of the chalcogen ions. Accordingly the transition dipole moment increases. As a result of the energy dispersion the p orbitals of the chalcogen ion provides higher occupied states and consequently absorb photons in the visible range.

By using descriptor models, the present inventors have computed the photovoltaic efficiency, η, of the oxychalcogenide perovskites. In order to assess the applicability of NaMO$_2$Q as promising material for photovoltaics, the present inventors use three measures. The first estimate is the practical theoretical efficiency limit calculated via the so-called spectroscopic limited maximum efficiency[40] (SLME), $\eta_Z$. The second one uses the improved descriptor model for solar cells[41] (IDMSC), $\eta_G$, assuming 1 μm thick absorber. The last measure is the normalized absorption length defined as:

$$L_\alpha = \frac{\int_0^\infty u(E)dE}{\int_0^\infty \alpha(E)u(E)dE},$$

where α(E) is the absorption spectrum calculated using the PBE functional and u(E) is the solar photon flux as a function of photon energy, E. The reference solar spectra ASTM G-173-03 (American Society for Testing and Materials) is used in all calculations.

All the photovoltaic efficiency models used take as input the calculated band gap and the shape of the absorption spectra. The band gap accuracy is of paramount importance for these models, hence the present inventors have employed the $GW_0$ values corrected to account for SOC. The PBE dielectric function was thus shifted using a scissors operator to account for such band gap correction. A comparative study of the various levels of theory result in the observation of a rigid shift of the band structures when moving from PBE to PBE+SOC, HSE06+SOC, $G_0W_0$ and $GW_0$, as shown in FIG. 6. Thus, the present inventors assume that the absorption peaks have the same shape regardless of the level of the theory except for a global shift described by the scissors operator. Since GW calculations including SOC are not available to us, our first strategy to correct the band gap is the following: the band gap is taken to be the one obtained with the $GW_0$ methods plus the SOC obtained at the PBE level, namely $$E_g = E_g(GW_0) + E_g(PBE+SOC) - E_g(PBE)$$

Figure 8:
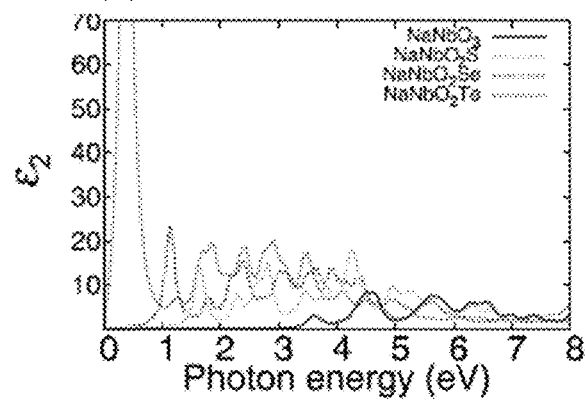
FIGS. 8A and 8B are graphs plotting imaginary part of dielectric function calculated by HSE06+SOC (HSE06=Heyd-Scuseria-Ernzerhof 2006) functional of (a) M=Nb and (b) M=Ta compounds.
Figure 8:
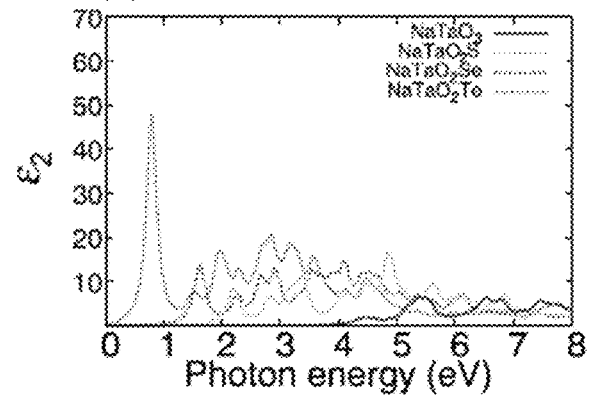

The calculated photovoltaic efficiency obtained by using the two models are summarized in Table 4. The present inventors obtain a maximum practical theoretical efficiency limit estimate for $NaMO_2Se$ of $\eta_Z$=30.1%, $\eta_G$=28.7% and $L_\alpha$=157 nm, values that are indicative of a very strong absorbing material. Due to its strong absorption as reflected in its short $L_\alpha$ and its suitable energy gap (1.46 eV), which is within the appropriate range for photovoltaics, $NaNbO_2Se$ appears promising for the development of thin-film and quantum-dot solar cells. The same result is obtained by the HSE06+SOC method as shown in FIG. 8.

TABLE 4

Prediction of the photovoltaic efficiency, $\eta_Z$, $\eta_G$, and the required absorption length, $L_\alpha$.

| Compound | $E_g^a$ (eV) | $\eta_Z^b$ (%) | $\eta_G^b$ (%) | $L_\alpha$ (nm) |
|---|---|---|---|---|
| $NaNbO_3$ | 3.26 | 1.7 | 2.2 | >10$^4$ |
| $NaNbO_2S$ | 1.82 | 26.6 | 25.6 | 196 |
| $NaNbO_2Se$ | 1.46 | 30.1 | 28.7 | 157 |
| $NaNbO_2Te$ | 0.46 | 12.7 | 9.3 | 40 |
| $NaTaO_3$ | 3.84 | 0.1 | 0.1 | >10$^4$ |
| $NaTaO_2S$ | 2.65 | 9.7 | 9.3 | 898 |
| $NaTaO_2Se$ | 1.99 | 23.0 | 22.2 | 284 |
| $NaTaO_2Te$ | 0.70 | 23.8 | 20.6 | 62 | a The band gap is adjusted in accord with the scissors operator;
b The prediction of efficiency is calculated according to the adjusted band gap.

In summary, up to now the present inventors have found out that apical oxygen substitution (⅓ O) with sulfur or selenium ($NaMO_2S$ and $NaMO_2Se$) changes the pristine material into a more efficient light absorber, featuring a short absorption length and making it suitable for thin-film and quantum-dot photovoltaic. Additional properties such as electronic transport and chemical stability are of paramount importance in the assessment of any newly proposed compounds and hence these will be evaluated in the next section.

Our PDOS analysis has indicated that the Q valence orbitals are hybridized strongly with the orbitals of neighboring atoms, suggesting a higher degree of energy dispersion in valence band manifold. The present inventors have then estimated the electronic transport properties of such compounds by extracting the effective masses, an analysis that helps us to quantify the relationship between the charge carrier mobility and the apical chalcogen atom. The holes and electrons effective mass tensors in a band are given by $$M^* = [m_{ij}^*] = \left[\hbar^2 \left(\frac{\partial^2 E_k}{\partial k_i \partial k_j}\right)^{-1}\right],$$

where k is the wave vector in the reciprocal space and $E_k$ is the corresponding band energy. The lighter (smaller) effective mass is found in bands where multiple states have lifted degeneracy. The present inventors have focused on the k-point path $\Gamma \rightarrow R$, since the higher degree of energy dispersion is turned out along this direction as considering only vertical transition from the valence band to the conduction band. When compared to pristine $NaNbO_3$ and $NaTaO_3$, oxychalcogenide perovskites have in general a higher mobility (lower hole and electron effective masses), as listed in Table 5. The increase in carrier mobility is more prominent with the increase of valence shell size, namely for Te substitution. This is an indication that the replacement of apical oxygen enhances the orbital overlap along the $\Gamma \rightarrow R$ direction, as clearly visible by a visual inspection of partial charge density. Such feature suggests that oxygen substitution improves the efficiency of the carrier photo generation, and both charge transport and collection.

TABLE 5

The lowest effective masses for holes ($m_h^*$) and electrons ($m_e^*$) at the extrema of the valence and conduction electronics bands in the unit of free electron mass, $m_e$, calculated by PBE functional.

| Compound | Direction | $m_h^*/m_e$ | $m_e^*/m_e$ |
|---|---|---|---|
| $NaNbO_3$ | $\Gamma \rightarrow R$ | 0.125 | 0.122 |
| $NaNbO_2S$ | $\Gamma \rightarrow R$ | 0.131 | 0.079 |
| $NaNbO_2Se$ | $\Gamma \rightarrow R$ | 0.086 | 0.066 |
| $NaNbO_2Te$ | $\Gamma \rightarrow R$ | 0.037 | 0.036 |
| $NaTaO_3$ | $\Gamma \rightarrow R$ | 0.121 | 0.129 |
| $NaTaO_2S$ | $\Gamma \rightarrow R$ | 0.141 | 0.096 |
| $NaTaO_2Se$ | $\Gamma \rightarrow R$ | 0.110 | 0.088 |
| $NaTaO2Te$ | $\Gamma \rightarrow R$ | 0.066 | 0.068 |

In order to assess the relative stability of the newly predicted compounds, the present inventors have adopted a linear programming (LP) algorithm with reference to stable compounds, which include the constituent elements. For example, the heat of formation of $NaNbO_2S$ can be calculated as, $$\Delta E_f(NaNbO_2S) =$$
$$E(NaNbO_2S) - \min_{c_i}\{c_1 E(Na) + c_2 E(Nb) + c_3 E(O_2) + c_4 E(S_8) +$$
$$c_5 E(Na_{a_5} Nb_{b_5}) + c_6 E(A_{a_6} O_{o_6}) + c_7 E(Na_{a_7} S_{s_7}) \ldots +$$
$$c_{n-1} E(Na_{a_{n-1}} Nb_{b_{n-1}} O_{o_{n-1}}) + c_n E(Na_{a_n} Nb_{b_n} S_{s_n})\},$$

where all the energies are the total energy of corresponding to stable compounds. In general, the ith compound consists of $a_i$ Na, $b_i$ Nb, $o_i$ O, or $s_i$ S atoms, and $c_i$ is its corresponding coefficient. The LP problem is solved with the constraints, ensuring the correct stoichiometry of $NaNbO_2S$ with $c_i \geq 0$.

$$\sum_i a_i c_i = 1,$$

$$\sum_i b_i c_i = 1,$$

$$\sum_i o_i c_i = 2,$$

$$\sum_i s_i c_i = 1,$$

Furthermore, in accordance with the decomposed compounds, the present inventors have calculated the energy above the convex Hull after having obtained the hyperplane, whose vertices indicate the decomposed compounds and the formation energies in the phase diagram. Since the compounds, which are taken from database are stable, their energy above the convex Hull is zero in the phase diagram.

As listed in Table 6, $NaNbO_2S$, $NaNbO_2Se$, $NaTaO_2S$ and $NaTaO_2Se$, which the present inventors have predicted to be efficient absorber, are all metastable with a heat of formation at most 100 meV above the convex Hull. However, as the valence shell increases in the chalcogen ion (e.g. in $NaNbO_2Te$ and $NaTaO_2Te$) the compounds become more unstable with heats of formation 200 meV above the convex Hull.

TABLE 6

Decomposition reaction of perovskite oxychalcogenide, heat of formation, $\Delta E_f$, and energy distance from the above Hull, $\Delta E_{Hull}$

| Decomposition Reaction | $\Delta E_f$ (eV/atom) | $\Delta E_{Hull}$ (eV/atom) | $\Delta E_{CH}$ (eV/atom) |
| --- | --- | --- | --- |
| $9NaNbO_2S \rightarrow 6 NaNbO_3 + 2 NaNbS_2 + NaS_2 + NbS_3$ | 0.08 | 0.07 | 78 |
| $6 NaNbO_2Se \rightarrow 4 NaNbO_3 + Na_2Se + NbSe_2 + NbSe_3$ | 0.08 | 0.09 | 88 |
| $12 NaNbO_2Te \rightarrow 8 NaNbO_3 + 2 Na_2Te + 3 NbTe_2 + NbTe_4$ | 0.25 | 0.25 | 248 |
| $9NaTaO_2S \rightarrow 6 NaTaO_3 + Na_2S + NaS_2 + 3 TaS_2$ | 0.04 | 0.04 | 40 |
| $6 NaTaO_2Se \rightarrow 4 NaTaO_3 + Na_2Se + TaSe_2 + TaSe_3$ | 0.10 | 0.04 | 38 |
| $12NaTaO_2Te \rightarrow 8 NaTaO_3 + 2 Na_2Te + 3 TaTe_2 + TaTe_4$ | 0.23 | 0.23 | 232 |

During the quantification of the heat of formation, all compounds have been set to be at zero pressure and zero temperature (T=0K). Furthermore, it is assumed that the compounds are decomposed into the most stable phase components among the same composition compounds with a linear combination of energies. Clearly, depending on the pressure, temperature and chemical environment, the free energy of a compound might differ. However, the change of entropy may be relatively small between the compounds in the reference pool and the oxycalcogenide perovskites examined in this work.

A large-scale data-mining study reported the observation that quaternary materials have a scale of metastability of less than 100 meV above the ground state. In this work, the quaternary compounds including sulfur and selenium are within such criterion of metastability (<~100 meV). All the reactions examined to form the oxycalcogenide perovskites are calculated endothermic. In particular, in relation to $NaTaO_2S$, there is experimental evidence that sulfur-doped $NaTaO_3$ has been experimentally synthesized with success.

The photovoltaic efficiency of S-doped $NaTaO_3$ was measured for a S concentration of up to 5% and the best efficiency for visible-light absorption was found at around 3%. This experimental evidence has inspired us to investigate lower S-concentrations.

The present inventors have discussed previously the correlation between the valence p orbital of the anion site with the band gap when replacing an apical oxygen atom with a chalcogen one (e.g. in $Na_8M_8O_{23}S$). In order to study the low chalcogen-concentration limit, the present inventors have now replaced an oxygen atom with a chalcogen one among the 24 sites available in a 2×2×2 supercell. This corresponds to a ~4% concentration. Our results show that the band gap decreases as the size of the valence shell of the anions gets larger, because of the deviation from the perovskite structure as well as the energy level alignment of the valence shell.

The DOSs computed with the PBE functional are presented in FIG. 16. It can be noted that even at the low concentration of 4% the states coming from the chalcogen atom contribute to the valence band top, thus introducing energy levels higher than those ascribed to oxygen. The band gap decreases as the compound is doped with sulfur, selenium and tellurium, similarly to what observed for the higher Q concentrations. The only exception is $Na_8Nb_8O_{23}S$, where one can note that the band gap is larger than that of pristine $NaNbO_3$ by 0.33 eV, despite the higher energy level of the S p orbitals. A careful analysis of the crystal and the band structures shows that the band gap is affected by a significant structural octahedral distortion in this particular case.

Figure 10:
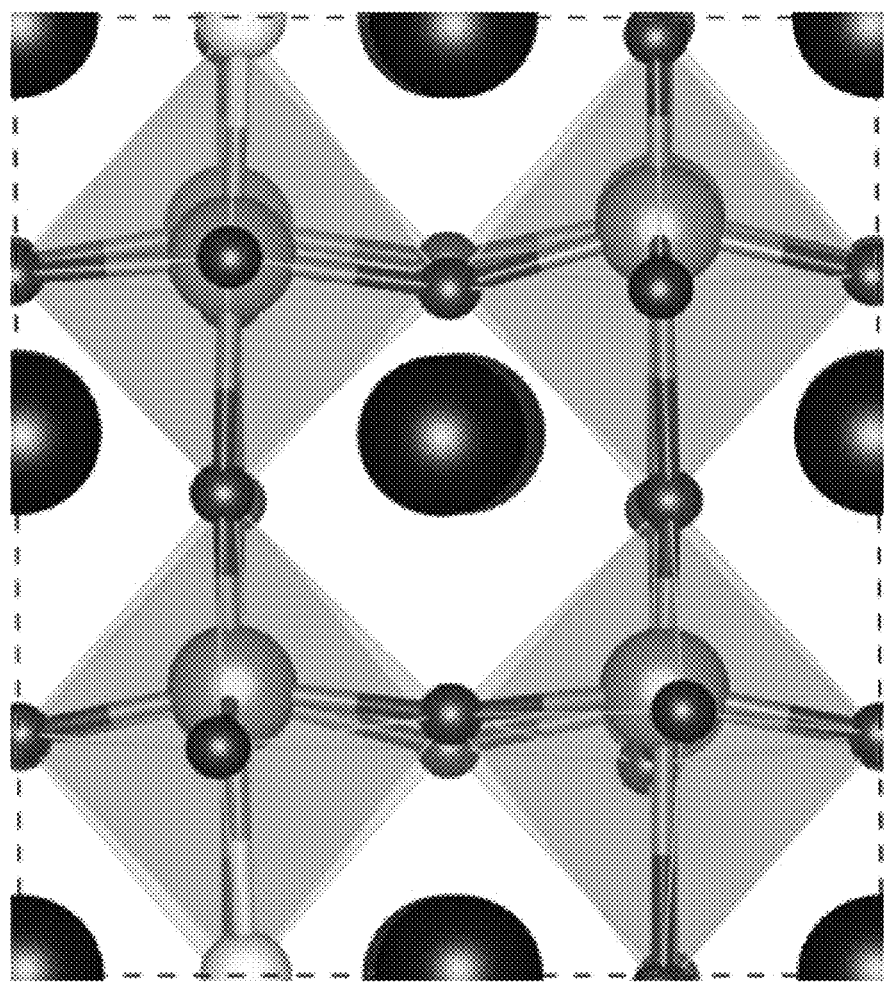
FIG. 10 is a graph plotting a relaxed structure of S-doped $NaNbO_3$ ($Na_8Nb_8O_{23}S$).
Figure 12:
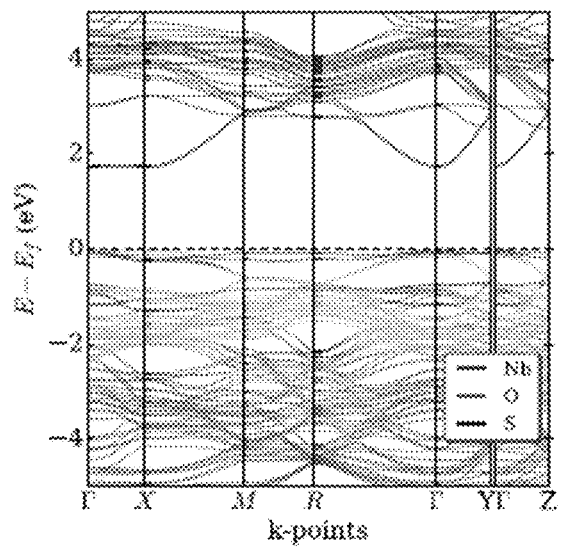
FIGS. 12A-12C are graphs plotting the band structure of doped (4%) system (2×2×2 supercell), (a) $Na_8Nb_8O_{23}S$, (b) $Na_8Nb_8O_{23}Se$, and (c) $Na_8Nb_8O_{23}Te$ compounds.
Figure 12:
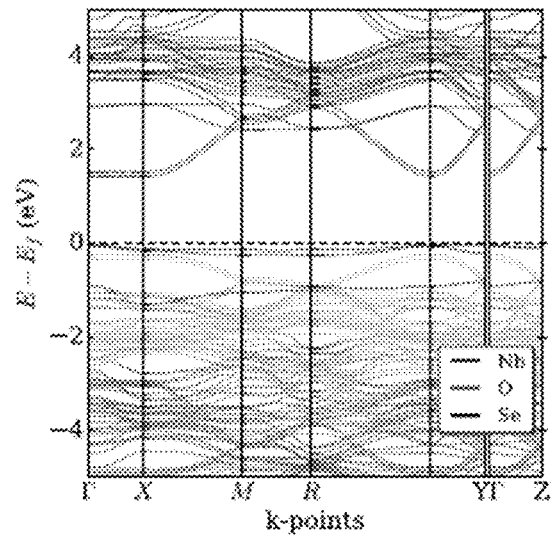
Figure 12:
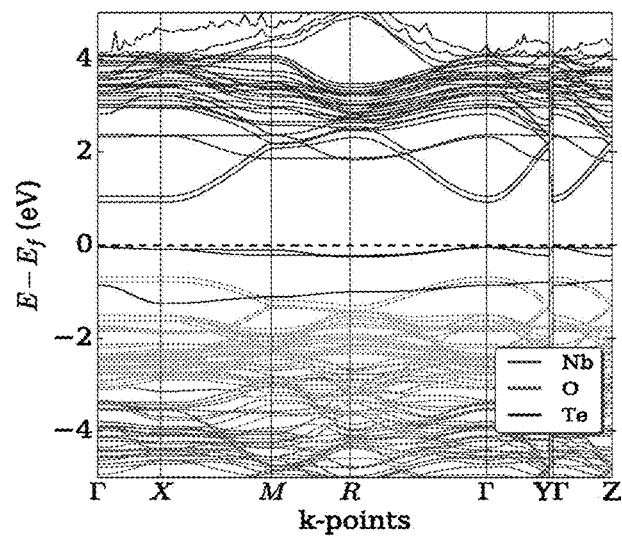

The present inventors have estimated the stability of these doped compounds and compared it with that of the oxychalcogenide perovskites, as shown in FIG. 17. As the valence shell size increases, the heat of formation increases as well. It can be noted that the heat of formation indicates that the dopant atom distorts the perovskite structure by inducing higher strain per Q atom, as compared to the corresponding oxychalcogenide perovskites. The longer Q-M bond length causes the distortion of the cubic structure, as shown for the relaxed geometry of $Na_8Nb_8O_{23}S$ in FIG. 10. If the chemical potentials are assumed as constant while substituting more chalcogen atoms, it can be noted that the heat of formation of the oxychalcogenide perovskites does not increase linearly. For $NaTaO_2S$ it increases only by about 10 meV per atom than S-doped perovskite, $Na_8Ta_8O_{23}S$.

In other words, in regard to the energy above convex Hull, doped system needs more 30 meV per Q atom to replace an oxygen. In contrast, oxychalcogenide perovskites require less 30 meV per Q atom. The ordered structure lowers the strain of the oxychalcogenide perovskite lattice, in contrast to the doped systems. $NaMO_3$-Q, oxychalcogenides powders with mixed O and Q anions may be challenging to form under equilibrium synthetic conditions such as sulfur substitution with corresponding oxides had been conducted experimentally by using $CS_2$ or $H_2S$ gas (thermodynamic stability). However, as the Q atoms are ordered in the structure, the required strain energy is lowered as the octahedral coordination is preserved.

The $NaMO_2Te$ perovskite structure in which 33% of the O sites are occupied by Te, is unstable with by over 200 meV. Furthermore, the band gap is too narrow or zero to absorb visible light. However, for a 4% Te concentration, as in $Na_8Nb_8O_{23}Te$ and $Na_8Ta_8O_{23}Te$, the band gap reduction still take place dropping by about 0.5 eV and the metastability scale is within less than 80 meV per atom (for both $\Delta E_f$ and $\Delta E_{Hull}$). As such Te-substitution appears as a more promising strategy to tailor the band gap, than S or Se substitution in dilute concentrations.

Furthermore, the present inventors have computed the band gaps and the chemical stabilities of 8%-doped systems by using a 2×1×2 supercell as illustrated in FIGS. 14A-14D. All calculations have been performed at the PBE level. The present inventors optimized the cell volume after relaxation of ions. The k-point was sampled according to the Monkhorst-Pack automatic generation scheme with 8×14×8 for 2×1×2 supercell. The Γ, M, R, X, Y and Z points indicate (0,0,0), (½,½,0), (½,½,½), (½,0,0), (0,½,0) and (0,0,½), respectively, in the Brillouin zone. In this case the present inventors have compared two possible configurations according to the atomic arrangements. The present inventors denote as $Na_4M_4O_{11}S$-α the case where an O ion is substituted with S forming a —S-M-O-M-S— chain along the x-axis. In contrast in the $Na_4M_4O_{11}S$-β configuration the substitution forms a —S-M-S— chain along the y-axis as shown in FIGS. 14A-B. A band gap reduction with respect to the 4%-doped case can be observed, even though the influence of the chalcogenides on the band gap depends on the configuration. For most doped systems, the band gap appears to be smaller when a chalcogen ion is in the -Q-M-Q- chain along the y-axis ($Na_4M_4O_{11}Q$-β), rather than in the $Na_4M_4O_{11}Q$-α arrangement. However, the stability decreases because of the more strain around the dopant anion. In comparison with the $Na_4Nb_4O_{11}S$ configurations, the band gap of $Na_4Nb_4O_{11}S$-α is smaller, since the conduction band is split more significantly and the S pushes consequently the edge of conduction band at the Γ point as shown in FIG. 14C-D.

FIG. 17 summarizes the band gaps, $E_g$, and the energies above convex Hull, $\Delta E_{Hull}$ as function of the chalcogen ratio. Increasing chalgogen substitution in Nb and Ta oxide perovskites reduces the electronic band gap providing an efficient band gap tuning mechanism towards photovoltaic applications. However, the chemical stability is altered tending towards the metastability of the resulting quaternary compounds.

The present inventors performed density functional theory (DFT) calculations using the projector-augmented wave (PAW) method as it is implemented in VASP code. The structures were fully relaxed by Perdew-Burke-Ernzerhof (PBE) formulation of the generalized gradient approximation (GGA) of the electron exchange and correlation energy. The present inventors optimized the volume and the shape of the cell as well as the atomic structure, considering all degrees of freedom. The energies and forces were converged within $1.0 \times 10^{-6}$ eV/atom and 0.01 eV/A, respectively. The cutoff energy for the plane-waves was 520 eV. The k-point was sampled according to the Monkhorst-Pack automatic generation scheme with 14×14×14, 8×8×8 and 8×14×8 for primitive unit cell, 2×2×2 and 2×1×2 supercells, respectively. When carrying out the GW calculations, which was started from PBE calculations, 5×5×5 k-points were sampled in Γ centered grid and used a plane-wave cutoff of 415 eV. And the present inventors performed the HSE06 calculations using 8×8×8 k-points in Γ centered grid with a plane-wave cutoff of 520 eV. Scissors operator was applied according to the equation, $$\Delta E_g = E_g(GW_0) + E_g(PBE+SOC) - E_g(PBE)$$

Adopting the linear programming algorithm, the present inventors determined a compound to be stable by using the database available from ICSD (ICSDWeb. http://www.fiz-karlsruhe.de/icsd_web.html) and the Materials Project (A Materials Genome Approach. http://materialsproject.org/.) through Pymatgen. The present inventors included anion correction for oxide and sulfide compounds to have relative energies be consistent with experimental values, since it is known that GGA functional underestimate the total energies of $O_2$ and $S_8$.

Figure 20:
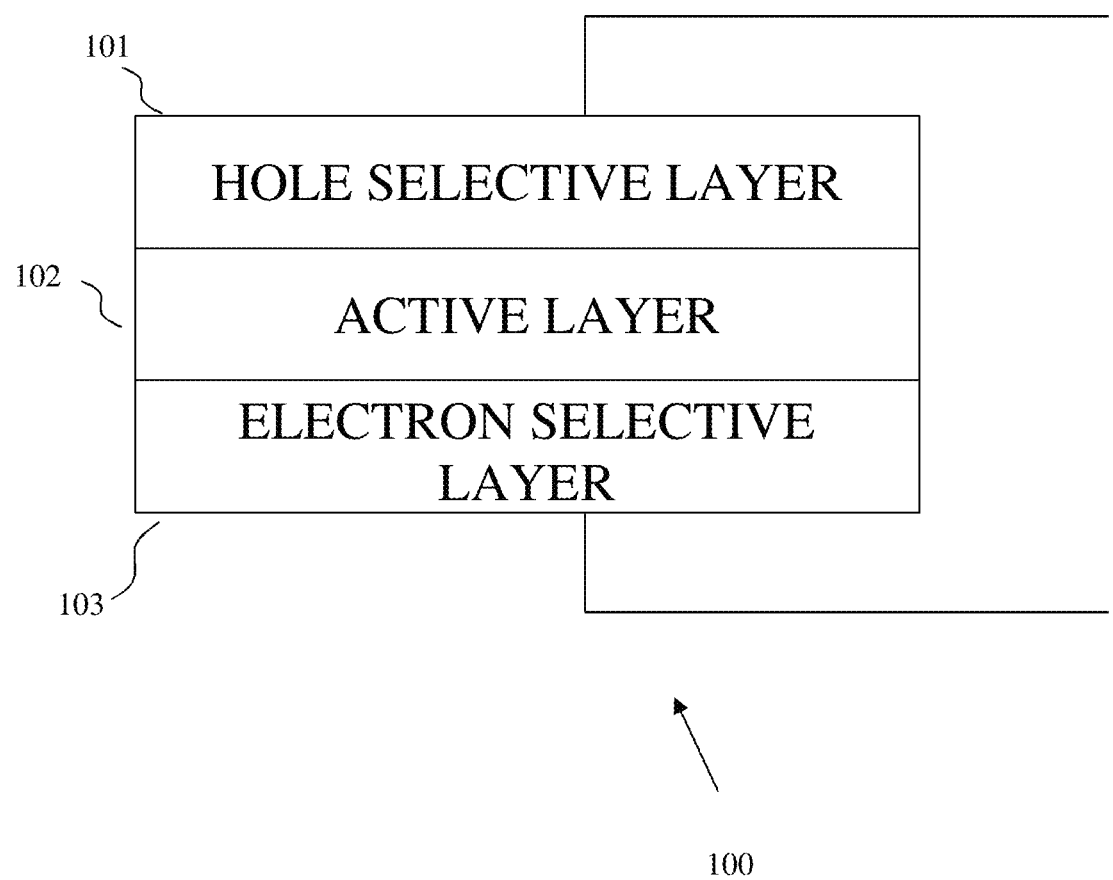
FIG. 20 is a cross section side view illustrating an embodiment of a semiconductor device.

FIG. 20 illustrates one implementation of the structure and operating principle of a perovskite oxychalcogenide semiconductor device 100. In implementations, a semiconductor device 100 can include, but are not limited to, devices such as photovoltaic devices, light emitting diodes, photodetectors, transistors, radiation sensors, solar cells, memristors, and so forth. As shown in FIG. 20, the semiconductor device 100 may include a hole selective layer 101, an electron selective layer 103, and an active layer 102 disposed between the hole selective layer 101 and the electron selective layer 103. The hole selective layer 101 functions as a cathode electrode. The electron selective layer 103 can include a anode electrode.

In some specific embodiments, the hole selective layer 101 can include an Al layer and/or an Ag layer that functions as a anode, and the electron selective layer 103 can include an indium-tin oxide (ITO) layer that functions as an cathode. In other specific embodiments, the hole selective layer 101 can include an indium-tin oxide (ITO) layer that functions as a anode, and the electron selective layer 103 can include an aluminum layer that functions as an cathode. Other materials may also be used to form the hole selective layer 101, such as calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and/or a combination of two or more of the above materials. Further, other materials may be used to form the electron selective layer 103 (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

The semiconductor device 100 may an active layer 102, which can include a photovoltaic perovskite oxychalcogenide material. In implementations, the active layer 102 serves to absorb light. In one specific example, The active layer 102 can be configured to absorb light having a wavelength in a first predetermined range, and the electron selective layer 103 may be transparent to light having a wavelength in a second predetermined range, the second predetermined range overlapping the first predetermined range in a third predetermined range. In this specific example, the semiconductor device 100 may have a high resistivity when not illuminated by any light and may have a low resistivity when illuminated by light having a wavelength in the third predetermined range. In an embodiment, the active layer 102 can include a perovskite oxychalcogenide compound. In some embodiments, the perovskite oxychalcogenide compound is $NaMO_2Q$, wherein M is Nb or Ta, and Q is S, Se or Te, which can function as a photovoltaic material. Furthermore, the perovskite oxychalcogenide compounds with the lower-chalcogenide concentration, $NaMO_xQ_{3-x}$ (2<x<3), wherein M is Nb or Ta, and Q is S, Se or Te, can function as a photovoltaic material.

It should be understood that various changes and modifications to the presently preferred embodiments described The invention is claimed as follows:

1. A photovoltaic material comprising:
   a perovskite oxychalcogenide compound,
   wherein the perovskite oxychalcogenide compound is $NaMO_2Q$, and wherein M is Nb or Ta, and Q is S, Se or Te.

2. The photovoltaic material of claim 1, wherein a band gap of the perovskite oxychalcogenide compound is direct.

3. The photovoltaic material of claim 1, wherein the perovskite oxychalcogenide compound is $NaNbO_2S$.

4. An optoelectronic device comprising:
   a perovskite oxychalcogenide compound,
   wherein the perovskite oxychalcogenide compound is $NaMO_2Q$, and wherein M is Nb or Ta, and Q is S, Se or Te.

5. The optoelectronic device of claim 4, wherein a band gap of the perovskite oxychalcogenide compound is direct.

6. The optoelectronic device of claim 4, wherein the perovskite oxychalcogenide compound is $NaNbO_2S$.

7. The optoelectronic device of claim 4, wherein the perovskite oxychalcogenide compound is $NaNbO_2Se$.

8. The optoelectronic device of claim 4, wherein the perovskite oxychalcogenide compound is $NaNbO_2Te$.

9. The optoelectronic device of claim 4, wherein the perovskite oxychalcogenide compound is $NaTaO_2S$.

10. The optoelectronic device of claim 4, wherein the perovskite oxychalcogenide compound is $NaTaO_2Se$.

11. The optoelectronic device of claim 4, wherein the perovskite oxychalcogenide compound is $NaTaO_2Te$.

12. The optoelectronic device of claim 4, wherein the optoelectronic device includes a solar cell device.

13. A solar cell device comprising:
    a hole selective layer;
    an electron selective layer; and
    an active layer disposed between the cathode layer and the anode layer,
    wherein the active layer includes a perovskite oxychalcogenide compound, and
    wherein the perovskite oxychalcogenide compound is $NaMO_2Q$, and wherein M is Nb or Ta, and Q is S, Se or Te.

14. The solar cell device of claim 13, wherein a band gap of the perovskite oxychalcogenide compound is direct.

15. The solar cell device of claim 13, wherein the perovskite oxychalcogenide compound is $NaNbO_2S$.

16. The solar cell device of claim 13, wherein the perovskite oxychalcogenide compound is $NaNbO_2Se$.

17. The solar cell device of claim 13, wherein the perovskite oxychalcogenide compound is $NaNbO_2Te$.

18. The solar cell device of claim 13, wherein the perovskite oxychalcogenide compound is $NaTaO_2S$.

19. The solar cell device of claim 13, wherein the perovskite oxychalcogenide compound is $NaTaO_2Se$.

20. The solar cell device of claim 1, wherein the perovskite oxychalcogenide compound is $NaTaO_2Te$.

* * * * *